(12) United States Patent
Yamazaki et al.

(10) Patent No.: US 9,275,875 B2
(45) Date of Patent: Mar. 1, 2016

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Ryosuke Watanabe, Ebina (JP); Suzunosuke Hiraishi, Atsugi (JP); Junichiro Sakata, Atsugi (JP)

(73) Assignee: SEMICONDUCTOR ENERGY LABORATORY CO., LTD, Kanagawa-ken (JP)

( * ) Notice: Subject to any disclaimer, the term of this patent is extended or adjusted under 35 U.S.C. 154(b) by 0 days.

(21) Appl. No.: 14/529,525

(22) Filed: Oct. 31, 2014

(65) Prior Publication Data
US 2015/0050775 A1    Feb. 19, 2015

Related U.S. Application Data

(62) Division of application No. 13/110,314, filed on May 18, 2011, now Pat. No. 8,906,756.

(30) Foreign Application Priority Data

May 21, 2010    (JP) .................... 2010-117332

(51) Int. Cl.
*H01L 21/00* (2006.01)
*H01L 21/84* (2006.01)
(Continued)

(52) U.S. Cl.
CPC ........ *H01L 21/477* (2013.01); *H01L 21/02554* (2013.01); *H01L 21/02565* (2013.01);
(Continued)

(58) Field of Classification Search
None
See application file for complete search history.

(56) References Cited

U.S. PATENT DOCUMENTS 5,289,300 A * 2/1994 Yamazaki et al. .............. 349/42
5,731,856 A    3/1998 Kim et al.
(Continued)

FOREIGN PATENT DOCUMENTS

CN    102187467 A    9/2011
EP    1737044 A    12/2006
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Evren Seven
(74) *Attorney, Agent, or Firm* — Robinson Intellectual Property Law Office; Eric J. Robinson

(57) ABSTRACT

An object is to provide a semiconductor device including an oxide semiconductor, which has stable electrical characteristics and high reliability. In a manufacturing process of a bottom-gate transistor including an oxide semiconductor layer, heat treatment in an atmosphere containing oxygen and heat treatment in vacuum are sequentially performed for dehydration or dehydrogenation of the oxide semiconductor layer. In addition, irradiation with light having a short wavelength is performed concurrently with the heat treatment, whereby elimination of hydrogen, OH, or the like is promoted. A transistor including an oxide semiconductor layer on which dehydration or dehydrogenation treatment is performed through such heat treatment has improved stability, so that variation in electrical characteristics of the transistor due to light irradiation or a bias-temperature stress (BT) test is suppressed.

15 Claims, 12 Drawing Sheets

(51) Int. Cl.
*H01L 21/477* (2006.01)
*H01L 21/02* (2006.01)
*H01L 29/786* (2006.01)
*H01L 29/66* (2006.01)
*H01L 27/12* (2006.01)

(52) U.S. Cl.
CPC .... *H01L21/02631* (2013.01); *H01L 29/66969* (2013.01); *H01L 29/7869* (2013.01); *H01L 27/1225* (2013.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,183,229 B2* | 2/2007 | Yamanaka | 438/795 |
| 7,211,825 B2* | 5/2007 | Shih et al | 257/72 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,382,421 B2 | 6/2008 | Hoffman et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,579,224 B2 | 8/2009 | Kuwabara et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,935,582 B2 | 5/2011 | Iwasaki | |
| 7,956,361 B2 | 6/2011 | Iwasaki | |
| 8,154,024 B2 | 4/2012 | Iwasaki | |
| 8,193,031 B2 | 6/2012 | Hosoba et al. | |
| 8,193,045 B2 | 6/2012 | Omura et al. | |
| 8,207,014 B2 | 6/2012 | Sasaki et al. | |
| 8,216,878 B2 | 7/2012 | Sasaki et al. | |
| 8,445,903 B2 | 5/2013 | Inoue et al. | |
| 8,518,740 B2 | 8/2013 | Yamazaki et al. | |
| 8,785,240 B2 | 7/2014 | Watanabe | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0013280 A1* | 1/2003 | Yamanaka | 438/487 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0275038 A1 | 12/2005 | Shih et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1* | 9/2006 | Hoffman et al. | 257/72 |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1* | 4/2008 | Pan et al. | 257/347 |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0210934 A1* | 9/2008 | Koinuma et al. | 257/43 |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0001881 A1 | 1/2009 | Nakayama | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1* | 6/2009 | Umeda et al. | 252/500 |
| 2009/0152541 A1 | 6/2009 | Maekawa et al. | |
| 2009/0153762 A1 | 6/2009 | Kuwabara et al. | |
| 2009/0159880 A1* | 6/2009 | Honda et al. | 257/43 |
| 2009/0278122 A1 | 11/2009 | Hosono et al. | |
| 2009/0280269 A1 | 11/2009 | Hosono et al. | |
| 2010/0012932 A1 | 1/2010 | Shieh et al. | |
| 2010/0025678 A1 | 2/2010 | Yamazaki et al. | |
| 2010/0032665 A1 | 2/2010 | Yamazaki et al. | |
| 2010/0044701 A1 | 2/2010 | Sano et al. | |
| 2010/0051938 A1 | 3/2010 | Hayashi et al. | |
| 2010/0051949 A1 | 3/2010 | Yamazaki et al. | |
| 2010/0059746 A1* | 3/2010 | Itai | 257/43 |
| 2010/0065844 A1 | 3/2010 | Tokunaga | |
| 2010/0078633 A1 | 4/2010 | Watanabe | |
| 2010/0084648 A1 | 4/2010 | Watanabe | |
| 2010/0085081 A1 | 4/2010 | Ofuji et al. | |
| 2010/0092800 A1 | 4/2010 | Itagaki et al. | |
| 2010/0109002 A1 | 5/2010 | Itagaki et al. | |
| 2010/0171117 A1 | 7/2010 | Kuwabara et al. | |
| 2010/0184253 A1* | 7/2010 | Hirai et al. | 438/104 |
| 2011/0003427 A1 | 1/2011 | Sasaki et al. | |
| 2011/0053322 A1 | 3/2011 | Sasaki et al. | |
| 2011/0198586 A1* | 8/2011 | Inoue et al. | 257/43 |

(56) References Cited

U.S. PATENT DOCUMENTS

| | | | |
|---|---|---|---|
| 2011/0240935 A1* | 10/2011 | Yano et al. | 252/519.51 |
| 2012/0126226 A1 | 5/2012 | Kuwabara et al. | |
| 2013/0234134 A1 | 9/2013 | Inoue et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-252697 A | 10/1990 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-357586 A | 12/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-311404 A | 11/2007 |
| JP | 2008-281988 A | 11/2008 |
| JP | 2009-099847 A | 5/2009 |
| JP | 2009-128761 A | 6/2009 |
| KR | 2011-0073536 A | 6/2011 |
| TW | 200910468 | 3/2009 |
| TW | 201027753 | 7/2010 |
| WO | WO-2004/114391 | 12/2004 |
| WO | WO-2008/126879 | 10/2008 |
| WO | WO-2010/047077 | 4/2010 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YBFE2O4, and YB2FE3O7 Types of Structures for Compounds in the IN2O3 and SC2O3-A2O3-BO Systems [A; FE, GA, Or AL; B: MG, MN, FE, NI, CU,Or ZN] at Temperatures Over 1000°C", Journal of Solid State Chemistry, 1985, vol. 60, pp. 382-384.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2: Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous IN-GA-ZN-Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its

(56) References Cited

OTHER PUBLICATIONS

Bending Properties", SID Digest '09: SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2: AL and SN-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al, "39.1: Invited Paper: Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Ohara.H et al., "21.3:4.0 IN. QVGA AMOLED Display Using IN-GA-ZN-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous IN-GA-ZN-Oxide TFT", SID Digest '09 : SID International Symposium Digest of Technical Papers, May 31, 2009, pp. 1110-1112.

Osada.T et al., "Development of Driver-Integrated Panel Using Amorphous IN-GA-ZN-Oxide TFT", AM-FPD '09 Digest of Technical Papers, Jul. 1, 2009, pp. 33-36.

Godo.H. et al., "Temperature Dependence of Characteristics and Electronic Structure for Amorphous IN-GA-ZN-Oxide TFT", AM-FPD '09 Digest of Technical Papers, Jul. 1, 2009, pp. 41-44.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In-Ga-Zn-0 TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZNO Thin-Film Transistors with Aluminum Oxide Dielectric Layers", J. Electrochem. Soc. (Journal of Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device including an oxide semiconductor.

In this specification, a semiconductor device means all types of devices which can function by utilizing semiconductor characteristics, and an electro-optical device, a semiconductor circuit, and an electronic device are all semiconductor devices.

2. Description of the Related Art

A technique for forming a transistor by using a semiconductor thin film formed over a substrate having an insulating surface has attracted attention. Such a transistor is applied to a wide range of electronic devices such as an integrated circuit (IC) or an image display device (display device). As a semiconductor thin film applicable to the transistor, a silicon-based semiconductor material is widely known. Moreover, an oxide semiconductor has been attracting attention as another material.

For example, a transistor whose active layer includes an amorphous oxide containing indium (In), gallium (Ga), and zinc (Zn) and having an electron carrier concentration of lower than $10^{18}/cm^3$ is disclosed (see Patent Document 1).

REFERENCE

Patent Document

[Patent Document 1] Japanese Published Patent Application No. 2006-165528

SUMMARY OF THE INVENTION

In some cases, electrical characteristics of an oxide semiconductor and a device including the oxide semiconductor are significantly changed owing to incorporation of impurities in a formation process thereof. A transistor including an oxide semiconductor shows unstable characteristics due to light irradiation or a bias-temperature stress test (a BT test) when, in particular, incorporation of hydrogen, moisture, or the like into the transistor occurs. That is, incorporation of impurities into an oxide semiconductor becomes a factor of reducing the reliability of a device.

In view of the above problems, an object of one embodiment of the present invention is to provide a semiconductor device including an oxide semiconductor, which has stable electrical characteristics and high reliability.

One embodiment of the present invention disclosed in this specification is to dehydrate or dehydrogenate an oxide semiconductor by sequentially performing heat treatment in an atmosphere containing oxygen and heat treatment in vacuum. In addition, irradiation with light having a short wavelength is performed concurrently with the heat treatment, whereby elimination of hydrogen, OH, or the like is promoted.

One embodiment of the present invention disclosed in this specification is a method for manufacturing a semiconductor device, including the sequential steps of: forming a gate electrode layer; forming a gate insulating layer over the gate electrode layer; forming an oxide semiconductor layer over the gate insulating layer so as to overlap with the gate electrode layer; increasing the temperature of the oxide semiconductor layer in an inert gas atmosphere, a dry air atmosphere, or an oxygen atmosphere; performing heat treatment in an oxygen atmosphere; performing heat treatment under reduced pressure; performing slow cooling in an oxygen atmosphere; forming a source electrode layer and a drain electrode layer which are electrically connected to the oxide semiconductor layer; and forming an insulating layer over the oxide semiconductor layer, the source electrode layer, and the drain electrode layer.

Another embodiment of the present invention disclosed in this specification is a method for manufacturing a semiconductor device, including the sequential steps of: forming a gate electrode layer; forming a gate insulating layer over the gate electrode layer; forming an oxide semiconductor layer over the gate insulating layer so as to overlap with the gate electrode layer; increasing the temperature of the oxide semiconductor layer in an inert gas atmosphere, a dry air atmosphere, or an oxygen atmosphere; performing heat treatment under reduced pressure; performing heat treatment in an oxygen atmosphere, and then performing slow cooling in the oxygen atmosphere; forming a source electrode layer and a drain electrode layer which are electrically connected to the oxide semiconductor layer; and forming an insulating layer over the oxide semiconductor layer, the source electrode layer, and the drain electrode layer.

In the above manufacturing method, the dew point of an atmosphere gas used in increasing the temperature, performing the heat treatment, and performing the slow cooling is −50° C. or lower, preferably −70° C. or lower, more preferably −80° C. or lower. The use of an atmosphere gas having a low dew point can prevent incorporation of impurities such as moisture into the oxide semiconductor as much as possible.

The temperature of the above heat treatment is higher than or equal to 250° C. and lower than or equal to 650° C., preferably higher than or equal to 350° C. and lower than or equal to 500° C., more preferably higher than or equal to 390° C. and lower than or equal to 460° C.

The above heat treatment may be performed in the state where the oxide semiconductor layer is irradiated with light having a wavelength longer than or equal to 350 nm and shorter than or equal to 450 nm. By irradiation with light having the above wavelength, a bond of a metal component and a hydrogen atom or a hydroxyl group in the oxide semiconductor layer is easily cut, so that dehydration or dehydrogenation can be performed easily.

The above heat treatment under reduced pressure and the above heat treatment in the oxygen atmosphere under dry condition may be repeated a plurality of times. By repeatedly performing the heat treatments, the amount of remaining hydrogen and moisture can be reduced.

After the above slow cooling, the oxide semiconductor layer may be subjected to oxygen doping treatment. Through the oxygen doping treatment, oxygen deficiency in the oxide semiconductor layer can be compensated and the oxide semiconductor layer can be brought into an oxygen-excess state.

According to one embodiment of the present invention, an oxide semiconductor layer is dehydrated or dehydrogenated through heat treatment. A transistor including the oxide semiconductor layer has improved stability, so that variation in electrical characteristics of the transistor due to light irradiation or a bias-temperature stress (BT) test is suppressed. Therefore, a transistor having stable electrical characteristics and a semiconductor device including the transistor can be manufactured.

DETAILED DESCRIPTION OF THE INVENTION

Hereinafter, embodiments of the invention disclosed in this specification will be described in detail with reference to the accompanying drawings. Note that the present invention is not limited to the following description, and it is easily understood by those skilled in the art that modes and details of the present invention can be modified in various ways. Therefore, the invention disclosed in this specification is not construed as being limited to the description of the following embodiments. Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, one embodiment of a semiconductor device and a method for manufacturing the semiconductor device will be described with reference to FIGS. 1A to 1C, FIGS. 2A to 2C, and FIGS. 3A to 3D. In this embodiment, a transistor including an oxide semiconductor layer will be described as an example of the semiconductor device.

Figure 1A:
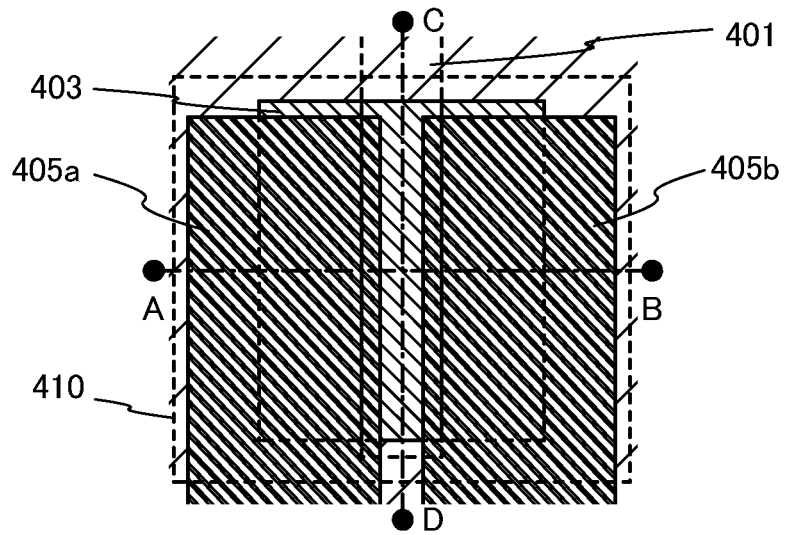
FIGS. 1A to 1C illustrate one example of a semiconductor device.
Figure 1B:
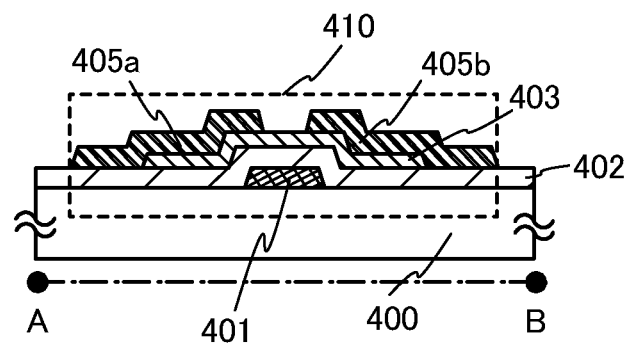
Figure 1C:
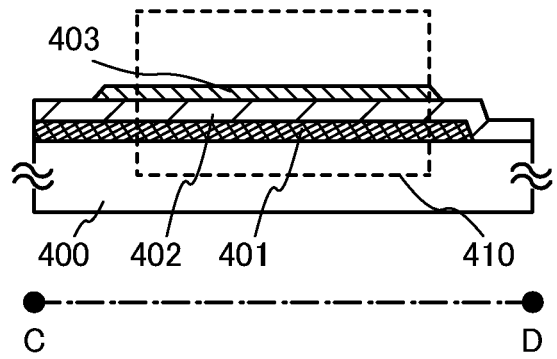

FIGS. 1A to 1C are a plan view and cross-sectional views, of a bottom-gate transistor as an example of a semiconductor device. FIG. 1A is a plan view, FIG. 1B is a cross-sectional view taken along line A-B of FIG. 1A, and FIG. 1C is a cross-sectional view taken along line C-D of FIG. 1A. Note that a gate insulating layer 402 is omitted in FIG. 1A.

A transistor 410 illustrated in FIGS. 1A to 1C includes, over a substrate 400 having an insulating surface, a gate electrode layer 401, the gate insulating layer 402, an oxide semiconductor layer 403, a source electrode layer 405a, and a drain electrode layer 405b.

Over the transistor 410, an insulating layer may be provided. In order to electrically connect the source electrode layer 405a or the drain electrode layer 405b to a wiring, an opening may be formed in the gate insulating layer 402 or the like. A second gate electrode layer may be provided above the oxide semiconductor layer 403. The oxide semiconductor layer 403 is desirably processed into an island shape but is not necessarily processed into an island shape.

Note that in a conventional transistor including an oxide semiconductor, the purity of an oxide semiconductor layer is low. For example, in some cases, electrical characteristics of the transistor become unstable owing to hydrogen, moisture, or the like in the oxide semiconductor layer.

In such a transistor, when a positive voltage is applied to a gate electrode, hydrogen ions having positive charge which exist in the oxide semiconductor layer are transferred to the back channel side (the side opposite to the gate insulating layer), and accumulated in the oxide semiconductor layer side of an interface between the oxide semiconductor layer and the insulating layer. The positive charge is transferred from the accumulated hydrogen ion to a charge trapping center (such as a hydrogen atom, water, or contamination) in the insulating layer, whereby negative charge is accumulated in the back channel side of the oxide semiconductor layer. In other words, a parasitic channel is generated on the back channel side of the transistor, and the threshold voltage is shifted to the negative side, so that the transistor tends to be normally on.

In order to suppress variation in electrical characteristics of the transistor, it is important that there be no impurity functioning as a charge trapping center or the quantity of such impurities be extremely small in the insulating layer. Therefore, a sputtering method through which less hydrogen is contained in film formation is preferably used for formation of the insulating film. In an insulating film formed by a sputtering method, there is no impurity functioning as a charge trapping center or the quantity of such impurities is extremely small, and thus, the transfer of positive charge is less likely to occur as compared with an insulating film formed by a CVD method or the like. Accordingly, the shift of the threshold voltage of the transistor can be suppressed and the transistor can be normally off.

On the other hand, when a negative voltage is applied to the gate electrode, hydrogen ions which exist in the oxide semiconductor layer are transferred to the gate insulating layer side and are accumulated in the oxide semiconductor layer side of the interface between the oxide semiconductor layer and the gate insulating layer. As a result, the threshold voltage of the transistor is shifted to the negative side.

In a state where a gate voltage is set to 0, the positive charge is released from the charge trapping center, so that the threshold voltage of the transistor is shifted to the positive side, thereby returning to the initial state. Alternatively, the threshold voltage is shifted to the positive side beyond the initial state. These phenomena indicate the existence of easy-to-transfer ions in the oxide semiconductor layer. It can be considered that an ion which is transferred most easily is an ion of hydrogen that is the smallest atom.

Note that in a bottom-gate transistor, when an oxide semiconductor layer is formed over a gate insulating layer and then heat treatment is performed thereon, not only water or hydrogen contained in the oxide semiconductor layer but also water or hydrogen contained in the gate insulating layer can be removed. Thus, in the gate insulating layer, the number of charge trapping centers is small. In this manner, the heat treatment for dehydration or dehydrogenation of the oxide semiconductor layer has also an effect of reducing charge trapping centers in the gate insulating layer. Therefore, in the bottom-gate transistor, the gate insulating layer may be formed by a CVD method.

In addition, the oxide semiconductor layer is irradiated with light having optical energy of a predetermined amount or more, whereby a bond of a metal element (M) and a hydrogen atom (H) (also referred to as an M-H bond) in the oxide semiconductor layer can be cut. Note that the optical energy having a wavelength of about 400 nm is equal to or substantially equal to the bond energy of a metal element and a hydrogen atom. When a negative gate bias is applied to a transistor in which the bond of a metal element and a hydrogen atom in the oxide semiconductor layer is cut, a hydrogen ion eliminated from the metal element is attracted to the gate electrode side, so that distribution of electrical charge is changed, the threshold voltage of the transistor is shifted to the negative side, and the transistor tends to be normally on.

Note that the hydrogen ions transferred to the interface of the gate insulating layer by light irradiation and application of the negative gate bias to the transistor are returned to the initial state by stopping application of the voltage. This is a typical example of the ion transfer in the oxide semiconductor layer.

In order to reduce such a change of the electrical characteristics by voltage application (BT deterioration) or a change of the electrical characteristics by light irradiation (light deterioration), it is the most effective to remove a hydrogen atom or an impurity containing a hydrogen atom such as water thoroughly from the oxide semiconductor layer to highly purify the oxide semiconductor layer.

The charge density in the oxide semiconductor layer as low as $10^{15}$ cm$^{-3}$, or the charge per unit area as low as $10^{10}$ cm$^{-2}$ does not affect the transistor characteristics or affects them very slightly. Therefore, it is preferable that the charge density be lower than or equal to $10^{15}$ cm$^{-3}$.

When 10% of hydrogen contained in the oxide semiconductor layer is transferred within the oxide semiconductor layer, it is preferable that the hydrogen concentration be lower than or equal to $10^{16}$ cm$^{-3}$. Further, in order to prevent entry of hydrogen from the outside after a device is completed, it is preferable that a silicon nitride film formed by a sputtering method be used as a passivation film to cover the transistor.

In order to solve such problems, one embodiment of the present invention relates to a method for sufficiently reducing impurities typified by hydrogen and moisture in an oxide semiconductor layer.

Figure 2A:
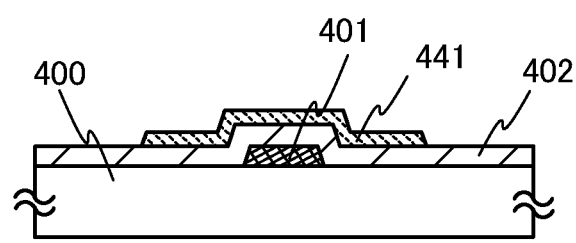
FIGS. 2A to 2C illustrate one example of a method for manufacturing a semiconductor device.
Figure 2B:
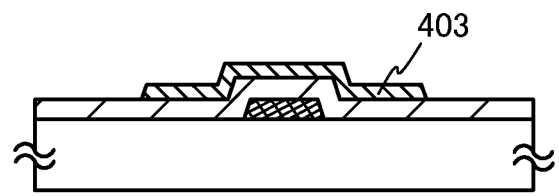
Figure 2C:
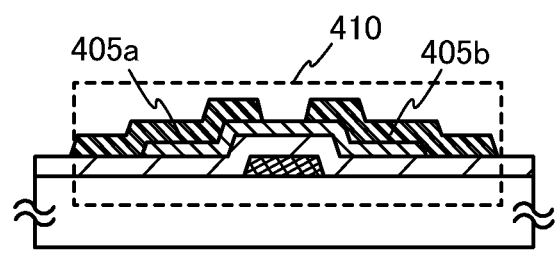

FIGS. 2A to 2C illustrate an example of a method for manufacturing the transistor 410.

First, a conductive film is formed over the substrate 400 having an insulating surface, and then, the gate electrode layer 401 is formed through a first photolithography step and an etching step.

Note that a resist mask used in the photolithography step may be formed by an inkjet method. Formation of the resist mask by an inkjet method needs no photomask; thus, manufacturing cost can be reduced.

Here, a substrate having heat resistance enough to withstand at least heat treatment performed later can be used for the substrate 400. For example, a glass substrate made of barium borosilicate glass, aluminoborosilicate glass, or the like, a ceramic substrate, a quartz substrate, or a sapphire substrate may be used. A single crystal semiconductor substrate or a polycrystalline semiconductor substrate made of silicon, silicon carbide, or the like; a compound semiconductor substrate made of silicon germanium or the like; an SOI substrate; or the like may be used as the substrate 400.

Further, a flexible substrate may be used as the substrate 400. In the case where a flexible substrate is used, the following methods can be given, and either of them may be used: a method in which a transistor including an oxide semiconductor layer is directly formed over a flexible substrate; and a method in which a transistor including an oxide semiconductor layer is formed over another substrate and is transferred to a flexible substrate. In the case where the method in which the transistor is transferred to a flexible substrate is employed, the substrate over which the transistor is formed may be provided with a separation layer.

An insulating film serving as a base film may be provided between the substrate 400 and the gate electrode layer 401. The base film prevents diffusion of an impurity element from the substrate 400, and can be formed using a silicon nitride film, a silicon oxide film, a silicon nitride oxide film, or a silicon oxynitride film. The structure of the base film is not limited to a single-layer structure, and may be a layered structure of a plurality of the above films.

The gate electrode layer 401 can be formed using a metal material such as molybdenum, titanium, tantalum, tungsten, aluminum, copper, neodymium, or scandium, or an alloy material which includes any of these metal materials as a main component by a sputtering method or the like. The structure of the gate electrode layer 401 is not limited to a single-layer structure, and may be a layered structure of a plurality of the above materials.

Next, the gate insulating layer 402 is formed over the gate electrode layer 401. The gate insulating layer 402 can be formed using any of silicon oxide, silicon nitride, silicon oxynitride, silicon nitride oxide, aluminum oxide, aluminum nitride, aluminum oxynitride, aluminum nitride oxide, hafnium oxide, and gallium oxide, or a mixed material thereof by a plasma CVD method, a sputtering method, or the like. The structure of the gate insulating layer 402 is not limited to a single-layer structure, and may be a layered structure of a plurality of the above materials.

It is preferable that an insulating material containing the same kind of component as the oxide semiconductor layer formed later be used for the gate insulating layer 402. Such a material enables the state of the interface with the oxide semiconductor layer to be kept well. Here, containing "the same kind of component as the oxide semiconductor layer" means containing one or more elements selected from constituent elements of the oxide semiconductor layer. For example, in the case where the oxide semiconductor layer is formed using an In—Ga—Zn-based oxide semiconductor material, gallium oxide or the like is given as such an insulating material containing the same kind of component as the oxide semiconductor layer.

For the formation of the gate insulating layer 402, a high-density plasma CVD method using microwaves (e.g., with a frequency of 2.45 GHz) is preferably employed because a high-quality insulating layer which is dense and has high breakdown voltage can be formed. The oxide semiconductor layer is formed in close contact with the high-quality gate insulating layer, whereby the interface state density can be reduced.

Moreover, it is possible to use as the gate insulating layer an insulating layer whose quality and characteristics of the interface with the oxide semiconductor layer are improved by heat treatment performed after the formation of the insulating layer. In any case, the gate insulating layer is preferably formed using an insulating layer that can reduce the interface state density with the oxide semiconductor layer to form a favorable interface, as well as having favorable film quality.

In order that hydrogen, a hydroxyl group, and moisture are contained as little as possible in an oxide semiconductor film formed over the gate insulating layer 402, vacuum heating is preferably performed on the substrate 400 over which layers up to and including the gate insulating layer 402 are formed, in a preheating chamber of a deposition apparatus, so that impurities such as hydrogen and moisture adsorbed to the substrate 400 are eliminated and removed. As an evacuation unit provided for the preheating chamber, a cryopump is preferably used. Similarly, this preheating may be performed on the substrate 400 over which layers up to and including the source electrode layer 405*a* and the drain electrode layer 405b are formed, before the formation of the insulating layer 407. Note that this preheating treatment may be omitted.

Next, over the gate insulating layer 402, an oxide semiconductor film with a thickness of larger than or equal to 2 nm and smaller than or equal to 200 nm, preferably larger than or equal to 5 nm and smaller than or equal to 30 nm is formed.

The oxide semiconductor layer includes at least one element selected from In, Ga, Sn, and Zn. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$. Here, an In—Ga—Zn—O-based oxide semiconductor means an oxide containing indium (In), gallium (Ga), and zinc (Zn), and there is no particular limitation on the composition ratio thereof. Further, the In—Ga—Zn—O-based oxide semiconductor may contain an element other than In, Ga, and Zn.

For the oxide semiconductor film, a thin film represented by the chemical formula, $InMO_3(ZnO)_m$ (m>0) can be used. Here, M represents one or more metal elements selected from Zn, Ga, Al, Mn, and Co. Specifically, M may be Ga, Ga and Al, Ga and Mn, Ga and Co, or the like.

In particular, when an oxide semiconductor containing indium, an oxide semiconductor containing indium and gallium, or the like is used, a transistor having favorable electrical characteristics can be formed. In this embodiment, an In—Ga—Zn—O film is formed as the oxide semiconductor film by a sputtering method.

As the target used for a sputtering method, an oxide target having a composition ratio of $In_2O_3:Ga_2O_3:ZnO=1:1:1$ [molar ratio] is used. Alternatively, an oxide target having a composition ratio of $In_2O_3:Ga_2O_3:ZnO=1:1:2$ [molar ratio] may be used.

In the case where an In—Zn—O-based material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, when a target used for forming an In—Zn—O-based oxide semiconductor has an atomic ratio of In:Zn:O=X:Y:Z, the relation of $Z>(1.5X+Y)$ is satisfied.

The filling rate of the target is higher than or equal to 90% and lower than or equal to 100%, preferably higher than or equal to 95% and lower than or equal to 100%. With the use of the target with high filling rate, a dense oxide semiconductor film can be formed.

As the sputtering gas, a rare gas (typically, argon), oxygen, or a mixed gas of a rare gas and oxygen can be used. It is preferable to use a high-purity gas from which impurities such as hydrogen, water, a hydroxyl group, and hydride are removed as the sputtering gas.

The oxide semiconductor film is preferably formed in the state where the substrate is heated. The substrate is held in a deposition chamber kept under reduced pressure, and deposition is performed in the state where the substrate temperature is set to a temperature higher than or equal to 100° C. and lower than or equal to 600° C., preferably higher than or equal to 200° C. and lower than or equal to 400° C.; thus, the impurity concentration in the oxide semiconductor film can be reduced.

In order to remove moisture remaining in the deposition chamber, an entrapment vacuum pump such as a cryopump, an ion pump, or a titanium sublimation pump is preferably used. As an evacuation unit, a turbo molecular pump provided with a cold trap may be used. In the deposition chamber which is evacuated with a cryopump, a hydrogen atom, a compound containing a hydrogen atom such as water, a compound containing a carbon atom, and the like are evacuated, whereby the impurity concentration in the oxide semiconductor film formed in the deposition chamber can be reduced.

As one example of the film formation condition, the following is given: the distance between the substrate and the target is 100 mm, the pressure is 0.6 Pa, the direct-current (DC) power is 0.5 kW, and the atmosphere is an oxygen atmosphere (the proportion of the oxygen flow is 100%). When a pulsed direct-current power source is used, powder substances (also referred to as particles or dust) that are generated in deposition can be reduced and the film thickness can be uniform.

Then, the oxide semiconductor film is processed into an island-shaped oxide semiconductor layer 441 through a second photolithography step and an etching step (see FIG. 2A).

Here, the etching of the oxide semiconductor film may be either dry etching or wet etching. Alternatively, both of them may be used. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used.

Next, dehydration or dehydrogenation of the oxide semiconductor layer 441 is performed through heat treatment. In this specification, the term "dehydration or dehydrogenation" refers to not only elimination of water or a hydrogen molecule but also elimination of a hydrogen atom, a hydroxyl group, or the like.

Through this heat treatment, excessive hydrogen (including water and a hydroxyl group) is removed and a structure of the oxide semiconductor layer is improved, so that an impurity level in energy gap can be reduced. The temperature of the heat treatment is higher than or equal to 250° C. and lower than or equal to 650° C., preferably higher than or equal to 350° C. and lower than or equal to 500° C., more preferably higher than or equal to 390° C. and lower than or equal to 460° C. The length of time of the heat treatment may be about 1 hour as long as the temperature is in the above favorable range. Note that the temperature and the length of time of the heat treatment may be determined as appropriate by a practitioner; for example, the heat treatment may be performed at low temperature for a long time, or at high temperature for a short time.

Here, one example of an electric furnace that can be used for the heat treatment of the oxide semiconductor layer 441 in this embodiment is described.

Figure 4:
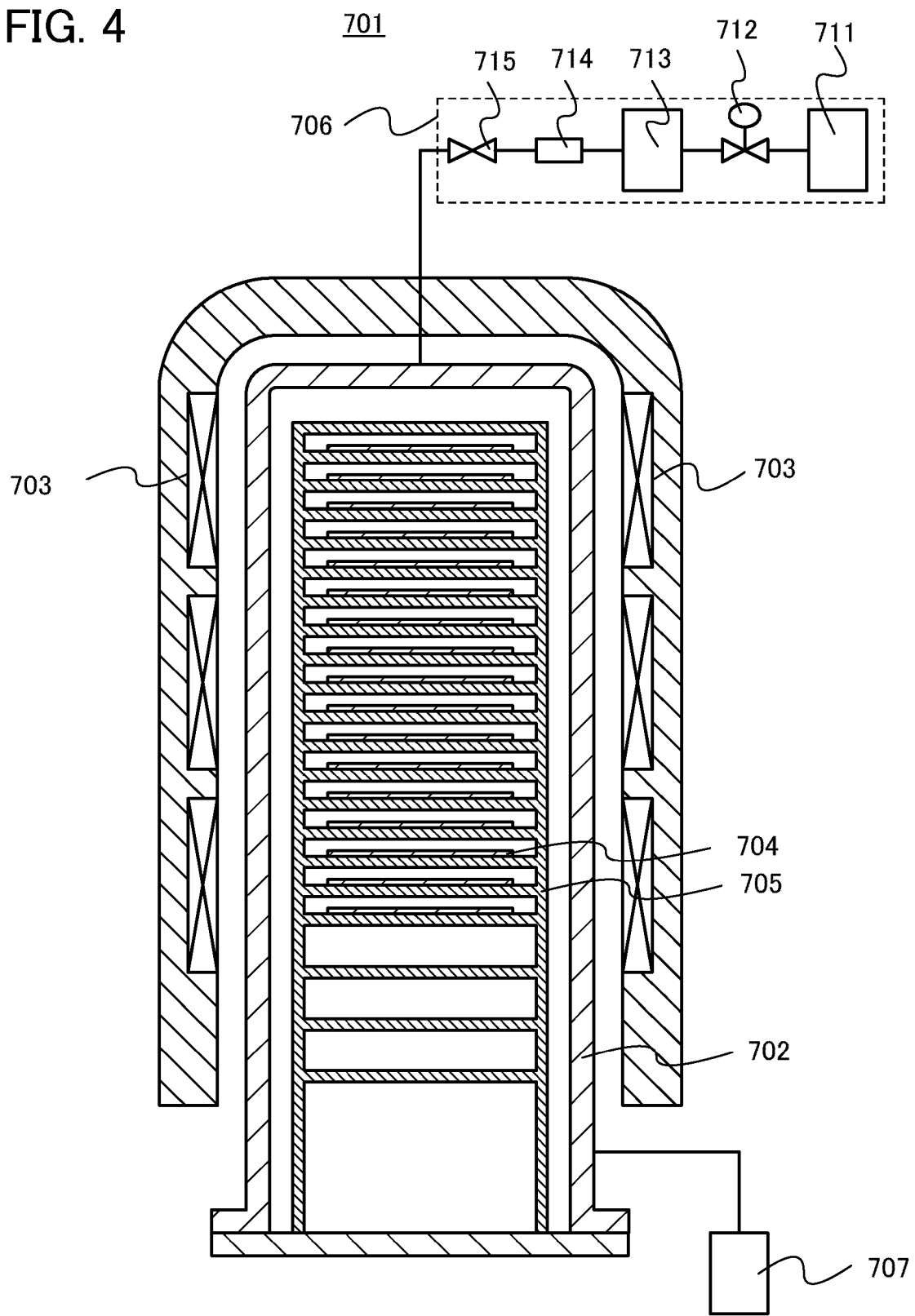
FIG. 4 illustrates one example of a heat treatment apparatus.

FIG. 4 is a schematic view of an electric furnace 701. Heaters 703 are provided outside a chamber 702. Inside the chamber 702, a susceptor 705 in which a substrate 704 is set is provided. In addition, the chamber 702 is connected to a gas supply means 706 and an evacuation means 707. The temperature in the electric furnace 701 preferably increases at higher than or equal to 0.1° C./min and lower than or equal to 20° C./min and decreases at higher than or equal to 0.1° C./min and lower than or equal to 15° C./min.

The gas supply means 706 includes a gas supply source 711, a pressure adjusting valve 712, a refining apparatus 713, a mass flow controller 714, and a stop valve 715. In this embodiment, the refining apparatus 713 is provided between the gas supply source 711 and the chamber 702. The refining apparatus 713 can remove impurities such as water and hydrogen in a gas which is introduced into the chamber 702.

In addition to the electric furnace, an apparatus for heating an object to be processed by heat conduction or heat radiation from a heater such as a resistance heater may be used as a heat treatment apparatus. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas.

In one embodiment of the present invention, nitrogen, dry air, oxygen, or the like is used as a gas for an atmosphere of the heat treatment. In the case where oxygen is used, there is no need to use only oxygen; for example, a gas mixed with an inert gas such as nitrogen or a rare gas may be used. In one embodiment of the present invention, heat treatment in the above gas atmosphere and heat treatment under reduced pressure are sequentially performed, whereby dehydration or dehydrogenation of the oxide semiconductor layer is thoroughly performed; thus, the highly purified oxide semiconductor layer is formed.

Note that it is preferable that water, hydrogen, and the like be not contained in the gas for the atmosphere of the heat treatment. For example, the purity of the gas is 6N (99.9999%) or more, preferably 7N (99.99999%) or more. The dew point of the gas is lower than or equal to −50° C., preferably lower than or equal to −70° C., more preferably lower than or equal to −80° C. With such a high-purity gas, hydrogen and moisture can be prevented from entering the oxide semiconductor layer as much as possible.

As specific examples of the heat treatment, a first method and a second method will be described below.

In the first method, the temperature of the oxide semiconductor layer is increased to the above temperature in a nitrogen atmosphere, a dry air atmosphere, or an oxygen atmosphere. Then, heat treatment is performed in an oxygen atmosphere. After that, the chamber in which the atmosphere gas is included is evacuated to a vacuum, and heat treatment is performed under reduced pressure; thus, dehydration or dehydrogenation of the oxide semiconductor layer is thoroughly performed. At this time, the heat treatment is preferably performed in a high-vacuum state without introducing an atmosphere gas. Then, the atmosphere is changed to an oxygen atmosphere again, and slow cooling is performed. Note that the "reduced pressure" is lower than normal pressure, and the "high-vacuum state" is $1 \times 10^{-3}$ Pa or lower, preferably $1 \times 10^{-4}$ Pa or lower, more preferably $1 \times 10^{-5}$ Pa or lower.

The control of the atmosphere in increasing the temperature is performed in order to prevent hydrogen and moisture from entering the oxide semiconductor layer as much as possible.

The reason why an oxygen atmosphere is used for the heat treatment performed just after the temperature is increased is that dehydration or dehydrogenation of the oxide semiconductor layer is promoted and in addition, oxygen deficiency in the oxide semiconductor layer is compensated and the oxide semiconductor layer is brought into an oxygen-excess state so that the proportion of oxygen is higher than the stoichiometric composition proportion. The oxide semiconductor layer is brought into an oxygen-excessive state, whereby oxygen deficiency can be sufficiently compensated.

The following heat treatment is performed under reduced pressure to further promote dehydration or dehydrogenation of the oxide semiconductor layer.

The slow cooling following that is performed in an oxygen atmosphere in order not to generate oxygen deficiency in the oxide semiconductor layer in decreasing the temperature.

Alternatively, the second method in which the atmospheres in the heat treatments are switched to each other may be employed. In the second method, the temperature of the oxide semiconductor layer is increased to the above temperature in a nitrogen atmosphere, a dry air atmosphere, or an oxygen atmosphere as in the first method. Then, the chamber in which the atmosphere gas is included is evacuated to a vacuum, and heat treatment is performed under reduced pressure. After that, heat treatment is performed in an oxygen atmosphere, and slow cooling is performed without changing the atmosphere.

The reasons why the atmospheres are controlled in increasing the temperature and performing the slow cooling in the second method are similar to those in the first method.

The reason why, just after the temperature is increased, the heat treatment is performed under reduced pressure is that dehydration or dehydrogenation of the oxide semiconductor layer is thoroughly promoted.

The heat treatment following that is performed in an oxygen atmosphere in order to compensate oxygen deficiency which is generated at the same time as the thorough dehydration or dehydrogenation under reduced pressure.

The heat treatment is performed by the first method or the second method, whereby dehydration or dehydrogenation of the oxide semiconductor layer can be thoroughly performed, and in addition, oxygen deficiency in the oxide semiconductor layer can be efficiently compensated. The oxide semiconductor layer is highly purified in such a manner, so that the oxide semiconductor layer 403 in which the number of carriers is extremely small and which can be called a substantially intrinsic semiconductor can be formed (see FIG. 2B).

Figure 12:
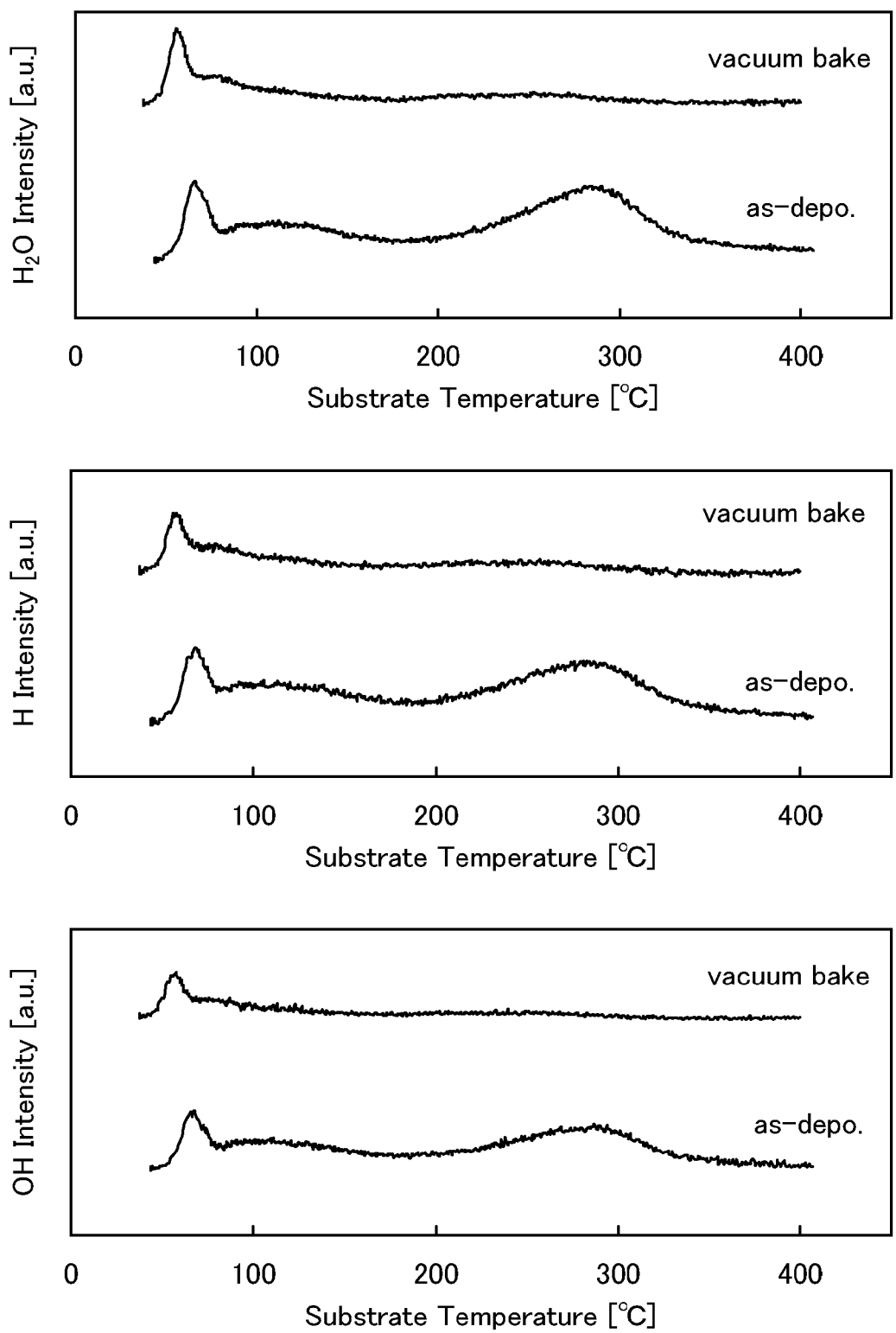
FIG. 12 shows TDS measurement results.

Here, gas discharge characteristics of the oxide semiconductor film (In—Ga—Zn—O film) which has been subjected to the heat treatment under reduced pressure are shown in FIG. 12 with the use of thermal desorption spectroscopy (TDS). $H_2O$, H, and OH are detected as detection objects, and a sample which is formed in such a manner that an oxide semiconductor film is subjected to heat treatment at 450° C. for 1 hour under reduced pressure ($2 \times 10^{-1}$ Pa) is compared with a sample which is formed in such a manner that the oxide semiconductor film is just formed.

As for the sample which is formed in such a manner that the oxide semiconductor film is just formed, any gas component has a peak at around 290° C. This peak is due to moisture contained in the film, or release of H or OH which has been bound to metal in the film. On the other hand, as for the sample which has been subjected to the heat treatment under reduced pressure, any gas component does not have a peak of release. These indicate that, through the heat treatment under reduced pressure, impurities such as $H_2O$, H, and OH have been released, and a highly purified oxide semiconductor film is formed.

Note that in the above first method or second method, heat treatment in a reduced-pressure state and heat treatment in an oxygen atmosphere may be repeated a plurality of times. By repeatedly performing the heat treatments, dehydration or dehydrogenation of the oxide semiconductor layer can be further promoted.

The temperature may be increased and the heat treatment may be performed in the state where the oxide semiconductor layer is irradiated with light having a short wavelength. By irradiation of the oxide semiconductor layer with light having a short wavelength, a bond of a metal component and a hydrogen atom or a hydroxyl group in the oxide semiconductor layer is easily cut; thus, dehydration or dehydrogenation can be performed easily. Specifically, the oxide semiconductor layer is preferably irradiated with light having a wavelength longer than or equal to 350 nm and shorter than or equal to 450 nm.

The heat treatment performed on the oxide semiconductor may be performed on the oxide semiconductor film which has not yet been processed into the island-shaped oxide semiconductor layer. In that case, after the heat treatment, a photolithography step is performed. The heat treatment may be performed after the source electrode layer and the drain electrode layer are formed over the island-shaped oxide semiconductor layer as long as the oxide semiconductor is deposited.

Oxygen doping treatment may be performed on the oxide semiconductor layer after the slow cooling. Through the oxygen doping treatment, oxygen deficiency in the oxide semiconductor layer can be compensated and the oxide semiconductor layer can be brought into an oxygen-excess state.

The oxygen doping treatment is addition of an oxygen radical, an oxygen atom, or an oxygen ion to a surface and the bulk of the oxide semiconductor layer. In particular, addition of an oxygen radical, an oxygen atom, or an oxygen ion to the surface and the bulk of the oxide semiconductor layer, with oxygen plasma is also called oxygen plasma doping treatment. The substrate over which the oxide semiconductor layer is formed is preferably biased.

An oxygen radial, an oxygen atom, and/or an oxygen ion with which the oxide semiconductor layer is doped can be generated with the use of a gas containing oxygen in a plasma generating apparatus. For example, a dry etching apparatus or the like can be used. Alternatively, an ozone generating apparatus may be used.

The oxygen doping treatment on the oxide semiconductor layer can be performed before the oxide semiconductor film is processed into the island-shaped oxide semiconductor layer as long as the heat treatment is performed before that oxygen doping treatment. Alternatively, the oxygen doping treatment may be performed after the source electrode layer and the drain electrode layer are formed over the island-shaped oxide semiconductor layer.

Next, a conductive film to be the source electrode layer and the drain electrode layer (including a wiring formed from the same layer as the source electrode layer and the drain electrode layer) is formed over the gate insulating layer 402 and the oxide semiconductor layer 403. As the conductive film serving as the source electrode layer and the drain electrode layer, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. Alternatively, a film of a high-melting-point metal such as titanium, molybdenum, or tungsten or a nitride film of any of them (e.g., a titanium nitride film, a molybdenum nitride film, or a tungsten nitride film) may be provided on one surface or both surfaces of a metal film such as an aluminum film or a copper film to form the conductive film serving as the source electrode layer and the drain electrode layer.

Alternatively, the conductive film serving as the source electrode layer and the drain electrode layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$; abbreviated to ITO), an indium oxide-zinc oxide alloy ($In_2O_3$—ZnO), or any of these metal oxide materials in which silicon oxide is contained can be used.

Next, a resist mask is formed over the conductive film in a third photolithography step and selective etching is performed, so that the source electrode layer 405a and the drain electrode layer 405b are formed. Then, the resist mask is removed.

Note that the etching of the conductive film is performed so that the oxide semiconductor layer 403 is not etched as much as possible. However, it is difficult to obtain etching conditions under which only the conductive film is etched. In some cases, the oxide semiconductor layer 403 is partly etched so as to have a groove portion (a recessed portion) by the etching of the conductive film.

In this embodiment, a titanium film is used as the conductive film and an In—Ga—Zn—O-based oxide semiconductor is used as the oxide semiconductor layer 403, and therefore, ammonium hydrogen peroxide (a mixture of ammonia, water, and hydrogen peroxide) is used as an etchant. By use of ammonia hydrogen peroxide as an etchant, the conductive film can be selectively etched.

Through the above process, the transistor 410 is formed (see FIG. 2C). The transistor 410 is a transistor including the oxide semiconductor layer 403 which is highly purified and from which impurities such as hydrogen, moisture, a hydroxyl group, and hydride (also referred to as a hydrogen compound) are intentionally removed. Therefore, variation in electrical characteristics of the transistor 410 is suppressed and the transistor 410 is electrically stable.

Figure 3A:
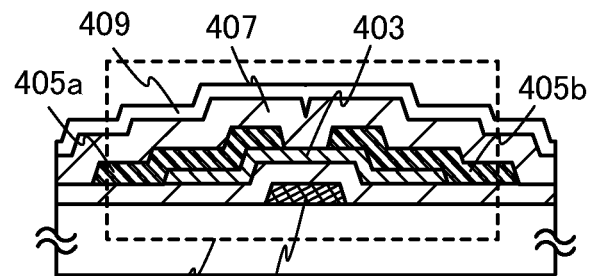
FIGS. 3A to 3D each illustrate one example of a semiconductor device.

Further, as illustrated in FIG. 3A, a transistor 440 in which the insulating layer 407 and an insulating layer 409 are provided over the oxide semiconductor layer 403, the source electrode layer 405a, and the drain electrode layer 405b can be formed.

The insulating layer 407 can be formed with a thickness of at least 1 nm using the above method by which impurities such as water and hydrogen are not mixed into the insulating layer as much as possible, as appropriate. In this embodiment, the insulating layer 407 is formed by a sputtering method. When hydrogen is contained in the insulating layer 407, hydrogen might enter the oxide semiconductor layer 403 or oxygen might be extracted from the oxide semiconductor layer 403 by hydrogen. If such a phenomenon is caused, the resistance of the oxide semiconductor layer 403 on the backchannel side might be decreased (the oxide semiconductor layer 403 on the backchannel side might have n-type conductivity) and a parasitic channel might be formed. Therefore, it is important that the insulating layer 407 contain as little hydrogen as possible.

As the insulating layer 407, an inorganic insulating film such as a silicon oxide film, a silicon oxynitride film, an aluminum oxide film, an aluminum oxynitride film, or a gallium oxide film can be typically used. In this embodiment, a 200-nm-thick gallium oxide film is formed as the insulating layer 407 by a sputtering method.

It is preferable that an insulating material containing the same kind of component as the oxide semiconductor layer 403 be used for the insulating layer 407, like the gate insulating layer 402. Such a material enables the state of the interface with the oxide semiconductor layer to be kept well. For example, in the case where the oxide semiconductor layer is formed using an In—Ga—Zn-based oxide semiconductor material, gallium oxide or the like is given as such an insulating material containing the same kind of component as the oxide semiconductor layer.

In the case where the insulating layer 407 has a layered structure, it is further preferable to employ a layered structure of an insulating film containing the same kind of component as the oxide semiconductor layer (hereinafter referred to as a film a) and a film containing a material different from the component material of the film a (hereinafter referred to as a film b). The reason is as follows. When the insulating layer 407 has such a structure in which the film a and the film b are sequentially stacked from the oxide semiconductor layer side, charge is trapped preferentially in a charge trapping center at the interface between the film a and the film b (compared with the interface between the oxide semiconductor layer and the film a). Thus, trapping of charge at the interface with the oxide semiconductor layer can be sufficiently suppressed, resulting in higher reliability of the semiconductor device.

For example, a layered structure in which a gallium oxide film and a silicon oxide film are stacked from the oxide semiconductor layer 403 side, or a layered structure in which a gallium oxide film and a silicon nitride film are stacked from the oxide semiconductor layer 403 side is preferably used as the insulating layer 407.

In this embodiment, a silicon oxide film is used as the insulating layer 407. The silicon oxide film can be formed by a sputtering method using a rare gas, oxygen, or a mixed gas of a rare gas and oxygen. The substrate temperature in film formation may be higher than or equal to room temperature and lower than or equal to 300° C. and in this embodiment, is 100° C. Further, a silicon oxide target or a silicon target can be used as a target. For example, the silicon oxide film can be formed with the use of a silicon target and oxygen as a sputtering gas.

In order to remove moisture remaining in the deposition chamber in formation of the insulating layer 407 in a manner similar to that of the formation of the oxide semiconductor film, an entrapment vacuum pump (such as a cryopump) is preferably used. From a deposition chamber evacuated with the use of the cryopump, a hydrogen atom, a compound containing a hydrogen atom such as water, a compound containing a carbon atom, or the like is evacuated; therefore, the impurity concentration in the formed insulating layer 407 can be reduced. In addition, as an evacuation unit for removing moisture remaining in the deposition chamber, a turbo molecular pump provided with a cold trap may be used.

It is preferable that a high-purity gas from which impurities such as hydrogen, water, a hydroxyl group, and hydride are removed be used as a sputtering gas when the insulating layer 407 is formed.

Heat treatment may be performed after the formation of the insulating layer 407. The method and atmosphere of the heat treatment can be similar to those of the above heat treatment for dehydration or dehydrogenation of the oxide semiconductor layer 441.

In the case where the insulating layer 407 contains oxygen and the heat treatment is performed in the state where the oxide semiconductor layer 403 is in contact with the insulating layer 407, oxygen can be further supplied to the oxide semiconductor layer 403 from the insulating layer 407 containing oxygen.

It is preferable to form the insulating layer 409 serving as a protective insulating layer over the insulating layer 407, in order to prevent impurities such as moisture and hydrogen from entering the oxide semiconductor layer 403 and to prevent discharge of oxygen from the gate insulating layer 402, the oxide semiconductor layer 403, the insulating layer 407, and the interfaces thereof. For the insulating layer 409, an inorganic insulating film such as a silicon nitride film or an aluminum oxide film can be used. For example, a silicon nitride film is formed by an RF sputtering method.

Heat treatment may be performed after the insulating layer 409 is formed. For example, the heat treatment can be performed at a temperature higher than or equal to 100° C. and lower than or equal to 200° C. in air for longer than or equal to 1 hour and shorter than or equal to 30 hours. This heat treatment may be performed at a fixed temperature once. Alternatively, the following change in temperature may be conducted plural times: the temperature is increased from room temperature to a temperature higher than or equal to 100° C. and lower than or equal to 200° C. and then decreased to room temperature.

In the case where the gate insulating layer 402 has a layered structure, it is preferable to employ a layered structure of an insulating film containing the same kind of component as the oxide semiconductor layer (hereinafter referred to as a film a) and a film containing a material different from the component material of the film a (hereinafter referred to as a film b). The reason is as follows. When the gate insulating layer 402 has such a structure in which the film a and the film b are sequentially stacked from the oxide semiconductor layer side, charge is trapped preferentially in a charge trapping center at the interface between the film a and the film b (compared with the interface between the oxide semiconductor layer and the film a). Thus, trapping of charge at the interface with the oxide semiconductor layer can be sufficiently suppressed, resulting in higher reliability of the semiconductor device.

Figure 3B:
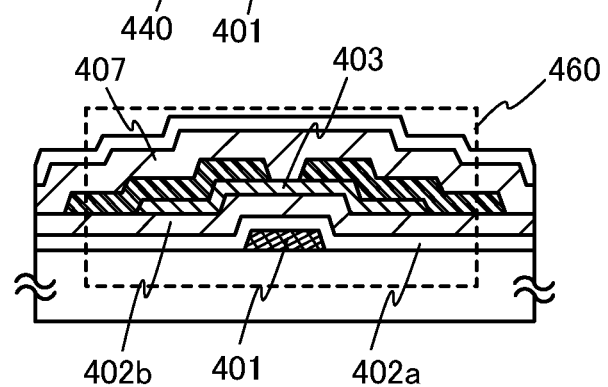

A transistor 460 in which a gate insulating layer has a layered structure is shown in FIG. 3B. In the transistor 460, a first gate insulating layer 402a and a second gate insulating layer 402b are stacked over the gate electrode layer 401, and the oxide semiconductor layer 403 is formed over the second gate insulating layer 402b. The second gate insulating layer 402b in contact with the oxide semiconductor layer 403 is an insulating film (film a) containing the same kind of component as the oxide semiconductor layer 403, and the first gate insulating layer 402a below the second gate insulating layer 402b is a film (film b) containing a material different from the component material of the second gate insulating layer 402b.

For example, in the case where an In—Ga—Zn-based oxide semiconductor film is used as the oxide semiconductor layer 403, a gallium oxide film can be used as the second gate insulating layer 402b, and a silicon oxide film can be used as the first gate insulating layer 402a. An insulating film containing the same kind of component as the oxide semiconductor layer 403 is also preferably used as the insulating layer 407 formed on and in contact with the oxide semiconductor layer 403.

Figure 3C:
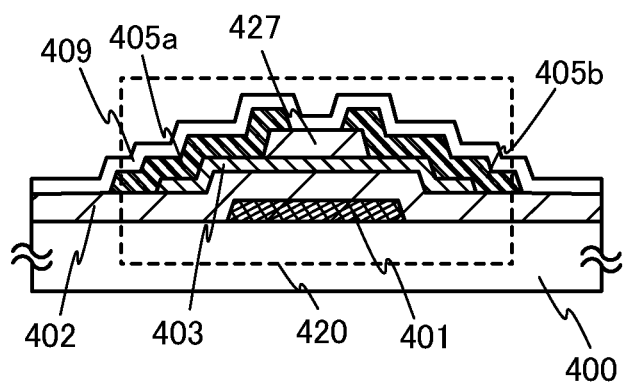
Figure 3D:
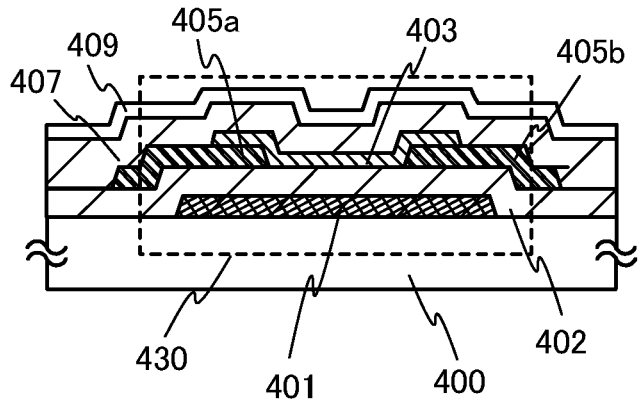

Other structures of transistors each including the oxide semiconductor layer 403 which is formed by the above method are illustrated in FIGS. 3C and 3D.

A transistor 420 in FIG. 3C is a kind of bottom-gate transistor, which is called a channel protective transistor. Further, it is also called an inverted staggered transistor.

The transistor 420 includes, over the substrate 400 having an insulating surface, the gate electrode layer 401, the gate insulating layer 402, the oxide semiconductor layer 403, an insulating layer 427 serving as a channel protective layer covering a channel formation region of the oxide semiconductor layer 403, the source electrode layer 405a, and the drain electrode layer 405b. The insulating layer 409 is formed so as to cover the transistor 420.

A transistor 430 illustrated in FIG. 3D is a kind of bottom-gate structure, which is called a bottom contact transistor.

The transistor 430 includes, over the substrate 400 having an insulating surface, the gate electrode layer 401, the gate insulating layer 402, the source electrode layer 405a, the drain electrode layer 405b, and the oxide semiconductor layer 403. The insulating layer 407 which covers the transistor 430 and is in contact with the oxide semiconductor layer 403 is provided. The insulating layer 409 is provided over the insulating layer 407.

Note that the method for manufacturing the transistor in this embodiment can be applied to a transistor having a top-gate structure.

In the transistors 410, 420, 430, 440, and 460 each including the highly purified oxide semiconductor layer 403, which are manufactured according to this embodiment, the current value in an off state (off current value) thereof can be low. These transistors have high reliability; for example, the amount of change in threshold voltage of each of the transistors between before and after light irradiation and the bias-temperature stress (BT) test is reduced.

Further, in the transistors 410, 420, 430, 440, and 460 each including the oxide semiconductor layer 403, relatively high field-effect mobility can be obtained, which enables high-speed operation. Consequently, with the above transistor provided in a pixel portion of a semiconductor device having a display function, high-quality images can be displayed. In addition, by using the transistor including the highly purified oxide semiconductor layer, a driver circuit portion and a pixel portion can be formed over one substrate, whereby the number of components of the semiconductor device can be reduced.

As described above, a transistor including an oxide semiconductor, which has stable electrical characteristics, can be formed, whereby a highly reliable semiconductor device can be provided.

Note that this embodiment can be implemented in combination with any of the other embodiments as appropriate.

Embodiment 2

A semiconductor device having a display function (also referred to as a display device) can be manufactured using the transistor described in Embodiment 1. Further, part or the whole of the driver circuit which includes transistors can be formed over the same substrate as the pixel portion, whereby a system-on-panel can be obtained.

Figure 5A:
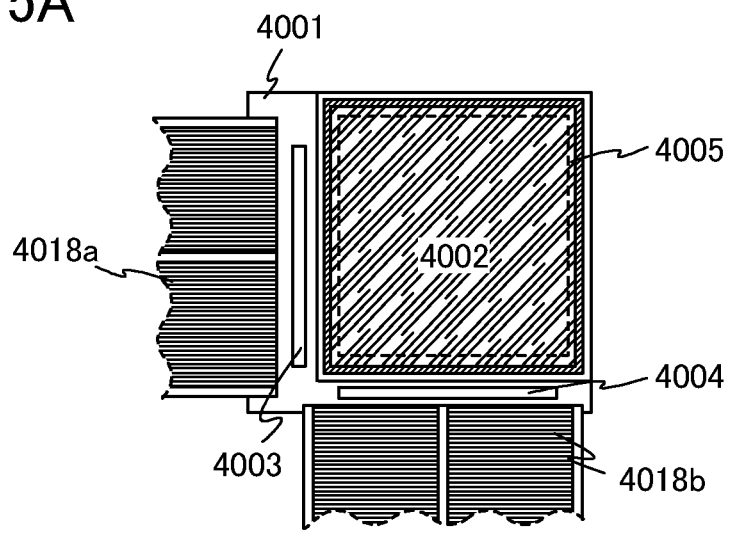
FIGS. 5A to 5C each illustrate one example of a semiconductor device.
Figure 5B:
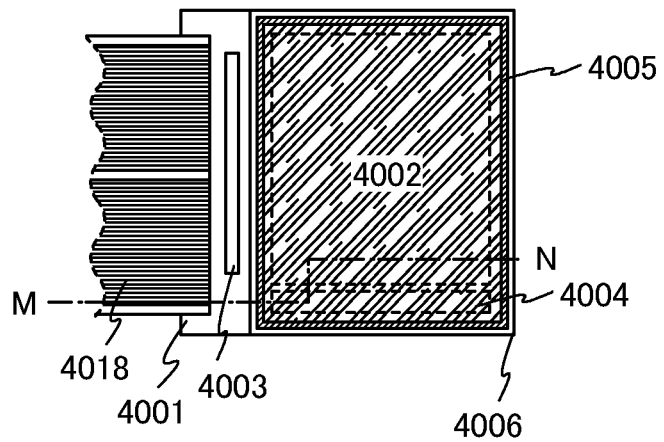
Figure 5C:
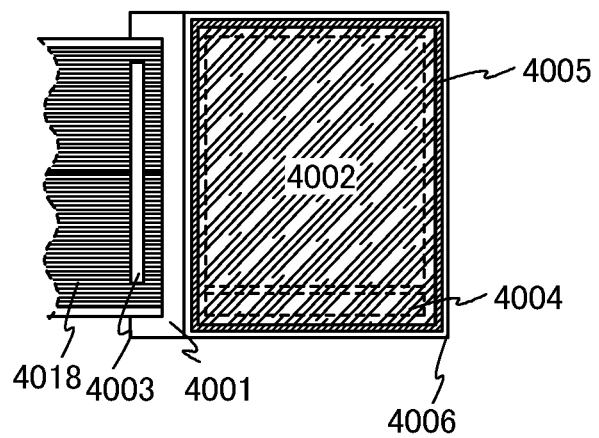

FIGS. 5A to 5C illustrate examples of a display device in this embodiment. In a display device of FIG. 5A, a pixel portion 4002 provided over a first substrate 4001 is sealed by the first substrate 4001, a sealant 4005 which is provided so as to surround the pixel portion, and a second substrate 4006. Further, a scan line driver circuit 4004 and a signal line driver circuit 4003 which are formed using a single crystal semiconductor or a polycrystalline semiconductor are mounted in a region different from the region surrounded by the sealant 4005 over the first substrate 4001. Various signals and potentials are supplied to the signal line driver circuit 4003 and the scan line driver circuit 4004 through flexible printed circuits (FPCs) 4018a and 4018b.

In display devices of FIGS. 5B and 5C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, in a region surrounded by the first substrate 4001, the second substrate 4006, and the sealant. Further, the signal line driver circuit 4003 which is formed using a single crystal semiconductor or a polycrystalline semiconductor is mounted in a region different from the region surrounded by the sealant 4005 over the first substrate 4001.

Here, a variety of signals and potentials are supplied to the signal line driver circuit 4003 which is formed separately, the scan line driver circuit 4004, or the pixel portion 4002 through an FPC 4018.

Although FIGS. 5B and 5C each illustrate an example of a display device in which only the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIGS. 5A and 5B each illustrate an example in which the driver circuit is mounted by a COG method, and FIG. 5C illustrates an example in which the driver circuit is mounted by a TAB method.

In addition, the display device may include a panel in which the display element is sealed, an IC including a controller on the panel, or the like.

Note that a display device in this specification means an image display device, a display device, or a light source (including a lighting device). Furthermore, the display device also includes the following modules in its category: a module to which an FPC or a TAB tape is attached; a module having a TAB tape at the tip of which a printed wiring board is provided; and a module in which an integrated circuit (IC) is directly mounted on a display element by a COG method.

The pixel portion and the scan line driver circuit provided over the first substrate can be formed with the use of the transistor described in Embodiment 1.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, can be used.

Figure 6:
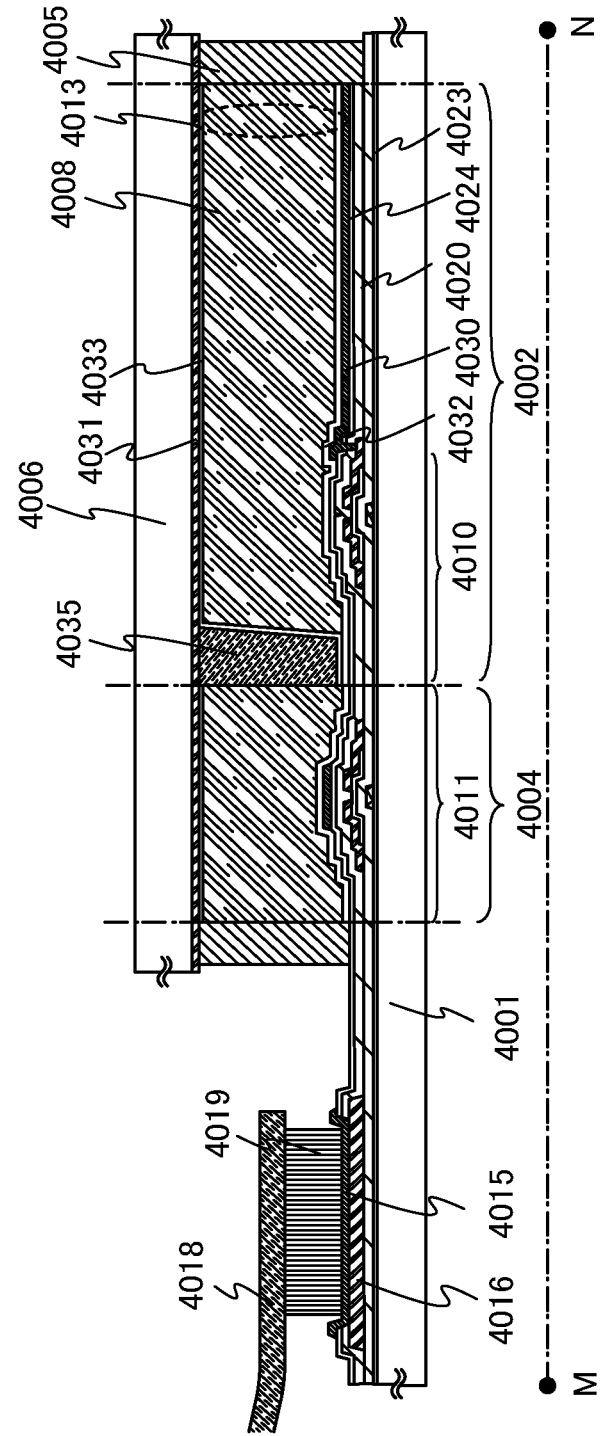
FIG. 6 illustrates one example of a semiconductor device.
Figure 7:
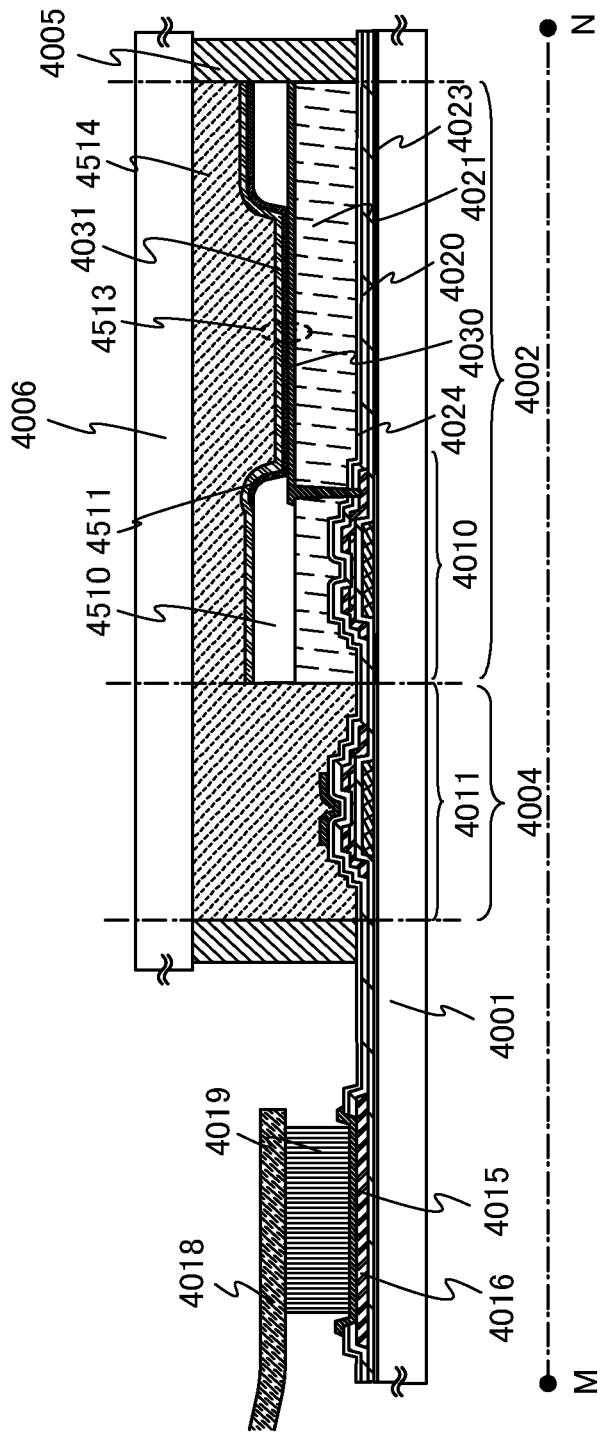
FIG. 7 illustrates one example of a semiconductor device.
Figure 8:
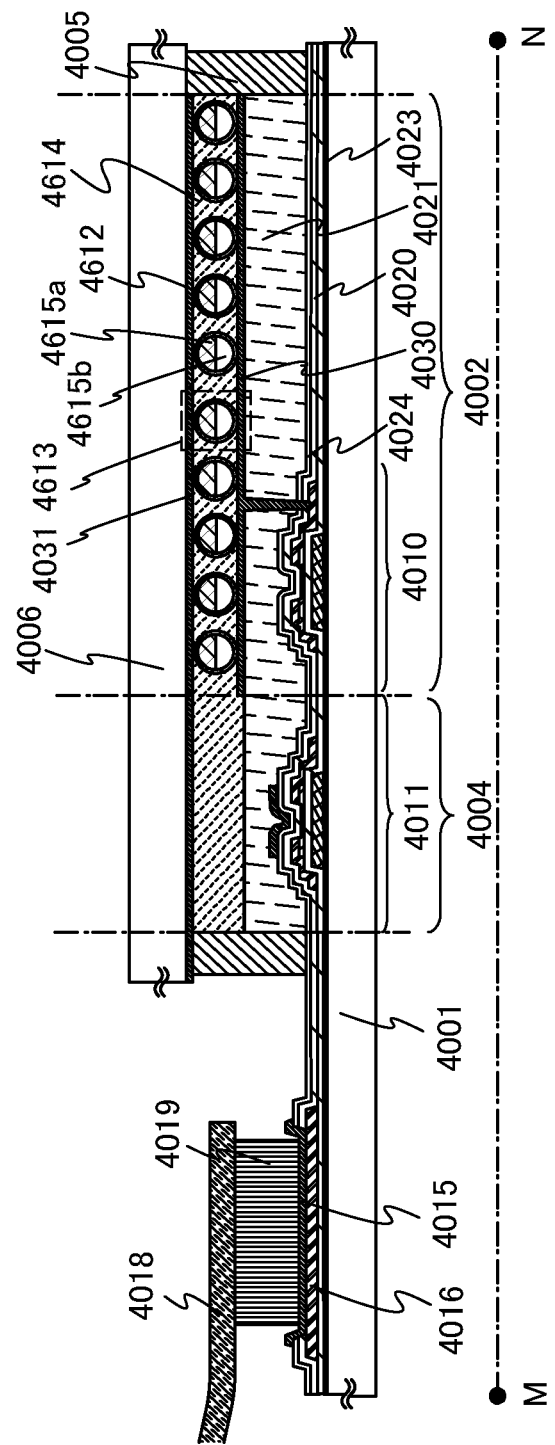
FIG. 8 illustrates one example of a semiconductor device.

Specific examples of the semiconductor device are described with reference to FIG. 6, FIG. 7, and FIG. 8. FIG. 6, FIG. 7, and FIG. 8 correspond to cross-sectional views taken along line M-N in FIG. 5B.

As illustrated in FIG. 6, FIG. 7, and FIG. 8, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

The pixel portion 4002 and the scan line driver circuit 4004 which are provided over the first substrate 4001 include a plurality of transistors. In FIG. 6, FIG. 7, and FIG. 8, the transistor 4010 included in the pixel portion 4002 and the transistor 4011 included in the scan line driver circuit 4004 are illustrated as an example. Insulating layers 4020 and 4024 are provided over the transistor. In addition, there are regions in which an insulating layer 4021 is provided in the semiconductor devices of FIG. 7 and FIG. 8. Note that an insulating layer 4023 is an insulating film serving as a base film.

In this embodiment, the transistor described in Embodiment 1 can be applied to the transistor 4010 and the transistor 4011. Variation in electrical characteristics of the transistor 4010 and the transistor 4011 is suppressed and the transistor 4010 and the transistor 4011 are electrically stable. Therefore, highly reliable semiconductor devices can be provided as the semiconductor devices of this embodiment illustrated in FIG. 6, FIG. 7, and FIG. 8.

In addition, in this embodiment, a conductive layer is provided over the insulating layer 4024 so as to overlap with a channel formation region of the oxide semiconductor layer in the transistor 4011 for the driver circuit. The potential of the conductive layer is the same as that of a gate electrode of the transistor 4011, whereby the conductive layer can also function as a second gate electrode. Needless to say, the conductive layer may be supplied with a different potential. The potential of the conductive layer may be GND, 0 V or the conductive layer may be in a floating state. By providing the conductive layer so as to overlap with the channel formation region of the oxide semiconductor layer, the amount of change in threshold voltage of the transistor 4011 between before and after the BT test can be further reduced.

In addition, the conductive layer functions to block an external electric field, (particularly, to prevent static electricity). That is, the external electric field is prevented from adversely affecting the inside (a circuit portion including the transistor); thus, variation in electrical characteristics of the transistor due to the influence of the external electric field such as static electricity can be prevented.

The transistor 4010 included in the pixel portion 4002 is electrically connected to a display element to drive the display element. A variety of display elements can be used as the display element as long as display can be performed.

An example of a liquid crystal display device using a liquid crystal element as a display element is illustrated in FIG. 6. A liquid crystal element 4013 includes the first electrode layer 4030, a second electrode layer 4031, and a liquid crystal layer 4008. Insulating layers 4032 and 4033 which serve as alignment films are formed so that the liquid crystal layer 4008 is provided therebetween.

A columnar spacer 4035 is provided in order to control the thickness of the liquid crystal layer 4008 (a cell gap). The columnar spacer 4035 is obtained by selective etching of an insulating film. Note that the spacer is not limited to a columnar spacer, and, for example, a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer in order to improve the temperature range. The liquid crystal composition which includes liquid crystal exhibiting a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, liquid crystal display devices can be manufactured with improved productivity.

The specific resistivity of the liquid crystal material is $1\times10^9$ Ω·cm or more, preferably $1\times10^{11}$ Ω·cm or more, more preferably $1\times10^{12}$ Ω·cm or more. The value of the specific resistivity in this specification is measured at 20° C.

The size of a storage capacitor formed in the liquid crystal display device is set in consideration of the leakage current of the transistor provided in the pixel portion or the like so that charge can be held for a predetermined period. By using the transistor including the highly purified oxide semiconductor layer, it is enough to provide a storage capacitor having a capacitance that is ⅓ or less, preferably ⅕ or less of a liquid crystal capacitance of each pixel.

In the transistor used in this embodiment, which includes the highly purified oxide semiconductor layer, the current value in an off state (off current value) can be made low. Accordingly, an electrical signal such as an image signal can be held for a long period, and a writing interval can be set long in an on state. Accordingly, the frequency of refresh operation can be reduced, which leads to an effect of suppressing power consumption.

In this embodiment, the transistor including the highly purified oxide semiconductor layer can have relatively high field-effect mobility and thus is capable of high-speed operation. Therefore, by using the transistor in the pixel portion of the liquid crystal display device, a high-quality image can be displayed. In addition, since the transistors can be provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. The vertical alignment mode is a method for controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, or the like can be used. Moreover, it is possible to use a method called domain multiplication or multi-domain design, in which a pixel is divided into some regions (subpixels) and molecules are aligned in different directions in their respective regions.

The liquid crystal display device includes a black matrix (a light-blocking layer), an optical member (an optical substrate) such as a polarizing member, a retardation member, or an anti-reflection member, and the like. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, so that current flows. The carriers (electrons and holes) are recombined, and thus, the light-emitting organic compound is excited. The light-emitting organic compound returns to a ground state from the excited state, thereby emitting light. An element which emits light with such a mechanism is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of a pair of electrodes is required to transmit light. The transistor and the light-emitting element are formed over the substrate. The light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. A light-emitting element having any of these emission structures can be used.

An example of a display device in which a light-emitting element is used as a display element is illustrated in FIG. 7. A light-emitting element 4513 is electrically connected to the transistor 4010 provided in the pixel portion 4002. The structure of the light-emitting element 4513 is, but not limited to, a layered structure of the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is preferable that the partition wall 4510 be formed to have an opening over the first electrode layer 4030 so that a sidewall is formed as an inclined surface with curvature over the first electrode layer 4030. Such an opening can be easily formed using a photosensitive resin material.

The electroluminescent layer 4511 can be formed with a single layer or a stacked layer of a plurality of layers.

A protective film may be formed over the second electrode layer 4031 and the partition wall 4510 in order to prevent entry of oxygen, hydrogen, moisture, carbon dioxide, and the like into the light-emitting element 4513. As the protective film, a silicon nitride film, a silicon nitride oxide film, a DLC film, or the like can be formed. In addition, in a sealed space which is formed with the first substrate 4001, the second substrate 4006, and the sealant 4005, a filler 4514 is provided. In this manner, it is preferable that the light-emitting element be packaged (sealed) with a protective film (such as a laminate film or an ultraviolet curable resin film) or a cover material with high air-tightness and little degasification.

As the filler 4514, an inert gas such as nitrogen or argon can be used. In addition, an ultraviolet curable resin or a thermosetting resin, such as polyvinyl chloride (PVC), acrylic, polyimide, an epoxy resin, a silicone resin, polyvinyl butyral (PVB), or ethylene vinyl acetate (EVA), can be used.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so that the glare is reduced can be performed.

Further, an electronic paper in which electronic ink is driven may be manufactured as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device has various modes. For example, the electrophoretic display device contains a plurality of microcapsules dispersed in a solvent or a solute, and each microcapsule contains first particles which are positively charged and second particles which are negatively charged. By application of an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (one of which may be colorless).

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules can each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As a structure of the electronic paper, a twisting ball display system can be used. The twisting ball display system refers to a method in which spherical particles each colored in black and white are arranged between a first electrode layer and a second electrode layer of a display element, and a potential difference is generated between the electrode layers to control orientation of the spherical particles, so that display is performed.

FIG. 8 illustrates, as one example of a display device, an active matrix electronic paper in which a twisting ball display system is employed.

Between the first electrode layer 4030 connected to the transistor 4010 and the second electrode layer 4031 provided for the second substrate 4006, spherical particles 4613 each of which includes a black region 4615a, a white region 4615b, and a cavity 4612 which is filled with liquid, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 6, FIG. 7, and FIG. 8, a flexible substrate as well as a glass substrate can be used as any of the first substrate 4001 and the second substrate 4006. For example, a plastic substrate having a light-transmitting property can be used. The plastic may be a fiberglass-reinforced plastics (FRP) plate, a polyvinyl fluoride (PVF) film, a polyester film, or an acrylic film. In addition, a sheet with a structure in which an aluminum foil is sandwiched between PVF films or polyester films can be used.

The insulating layer 4020 can be formed using a material including an inorganic insulating material, such as silicon oxide, silicon oxynitride, hafnium oxide, aluminum oxide, or gallium oxide. There is no particular limitation on the method for forming the insulating layer 4020, and for example, the insulating layer 4020 may be formed by a deposition method such as a plasma CVD method or a sputtering method. A sputtering method or the like is preferable in terms of low possibility of entry of hydrogen, water, and the like.

The insulating layer 4024 serving as a protective film of the transistors can be formed using a silicon nitride film, a silicon nitride oxide film, an aluminum oxide film, an aluminum nitride film, an aluminum oxynitride film, or an aluminum nitride oxide film. The structure of the insulating layer 4024 is not limited to a single-layer structure of the above film, and may be layered structure of different films. The insulating layer 4024 is preferably formed by a sputtering method.

The insulating layer 4021 can be formed using an organic insulating material or an inorganic insulating material. Note that the insulating layer 4021 formed using a heat-resistant organic insulating material such as an acrylic resin, polyimide, a benzocyclobutene-based resin, polyamide, or an epoxy resin is preferably used as a planarizing insulating film. In addition to such organic insulating materials, it is possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method, screen printing, or offset printing), a roll coating method, a curtain coating method, a knife coating method, or the like.

The above display device displays an image with the use of light emitted from a light source or a display element; however, it may utilize reflection of external light. In either case, the thin films such as the insulating film and the conductive film and the substrate provided for the pixel portion each need to have a light-transmitting property with respect to light in the visible-light wavelength range.

The first electrode layer 4030 and the second electrode layer 4031 of a transmissive liquid crystal display device and the second electrode layer 4031 of a reflective liquid crystal display device, a light-emitting device, and an electronic paper can be formed using a light-transmitting conductive material such as indium oxide containing tungsten oxide, indium oxide containing titanium oxide, an indium oxide-tin oxide alloy containing titanium oxide, an indium oxide-tin oxide alloy, or an indium oxide-zinc oxide alloy. Alternatively, any of these metal oxide materials to which silicon oxide is added may be used.

The first electrode layer 4030 of the reflective liquid crystal display device, the light-emitting device, and the electronic paper can be formed using a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); a nitride of these metals; or an alloy of a plurality of these metals.

Since the transistor is easily broken owing to static electricity or the like, a protection circuit for protecting the driver circuit is preferably provided. The protection circuit is preferably formed using a nonlinear element.

This embodiment can be implemented in combination with any of the other embodiments as appropriate.

Embodiment 3

A semiconductor device having an image sensor function for reading data of an object can be formed with the use of the transistor an example of which is described in Embodiment 1.

Figure 9A:
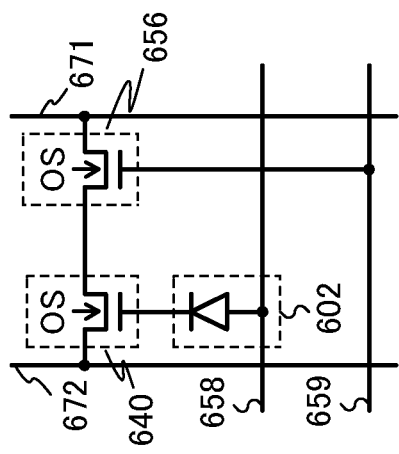
FIGS. 9A and 9B illustrate one example of a semiconductor device having an image sensor function.
Figure 9B:
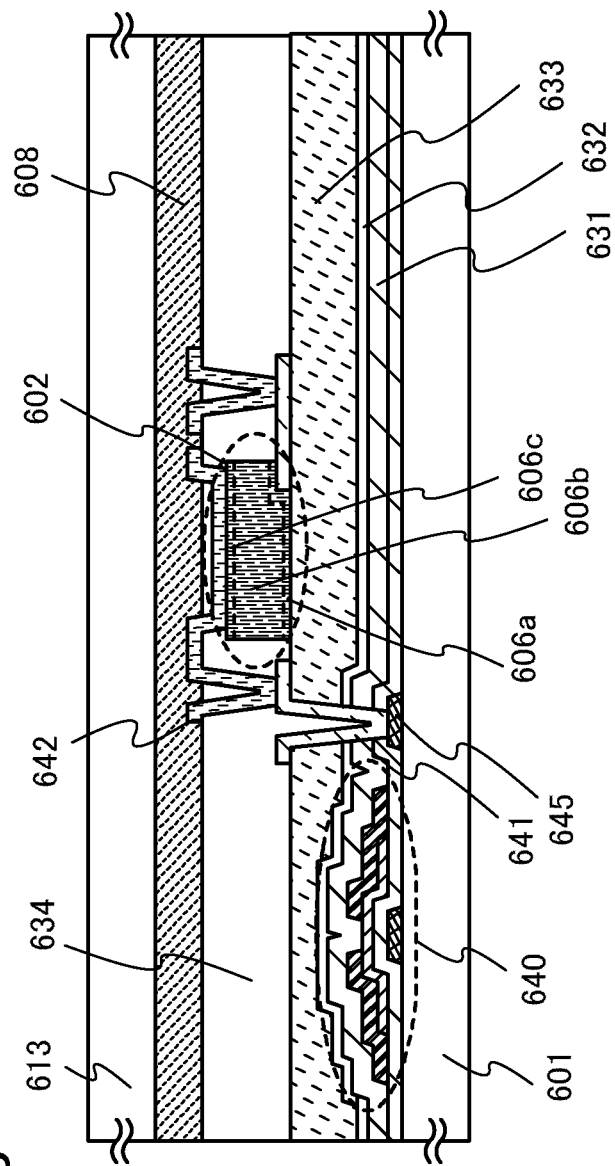

An example of a semiconductor device having an image sensor function is illustrated in FIGS. 9A and 9B. FIG. 9A illustrates an equivalent circuit of a photo sensor, and FIG. 9B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photo sensor output signal line 671.

Note that in a circuit diagram in this specification, a transistor which preferably includes an oxide semiconductor is denoted by a symbol "OS" so that it can be clearly identified as a transistor which includes an oxide semiconductor. The transistor 640 and the transistor 656 in FIG. 9A are transistors each including an oxide semiconductor layer.

FIG. 9B is a cross-sectional view illustrating part of the photo sensor formed over a substrate 601 having an insulating surface, which shows a structure of the photodiode 602 and the transistor 640. A substrate 613 is provided over the photodiode 602 and the transistor 640 with the use of an adhesive layer 608.

An insulating layer 631, a protective insulating layer 632, a first interlayer insulating layer 633, and a second interlayer insulating layer 634 are provided over the transistor 640. The photodiode 602 is provided over the first interlayer insulating layer 633. In the photodiode 602, a first semiconductor layer 606a, a second semiconductor layer 606b, and a third semiconductor layer 606c are sequentially stacked from the first interlayer insulating layer 633 side, between the electrode layer 641 formed over the first interlayer insulating layer 633 and the electrode layer 642 formed over the second interlayer insulating layer 634.

In this embodiment, the transistor described in Embodiment 1 can be applied to the transistor 640. Variation in electrical characteristics of the transistor 640 and the transistor 656 is suppressed and the transistor 640 and the transistor 656 are electrically stable. Therefore, a highly reliable semiconductor device can be formed with the use of the transistor 640 and the transistor 656 for the structure of the photo sensor illustrated in FIGS. 9A and 9B.

The electrode layer 642 is electrically connected to the gate electrode 645 through the electrode layer 641. The gate electrode 645 is electrically connected to a gate electrode of the transistor 640, and one electrode of the photodiode 602 is electrically connected to the transistor 640.

Here, the photodiode 602 is shown as an example of a PIN photodiode, in which the first semiconductor layer 606a having p-type conductivity, the second semiconductor layer 606b having i-type conductivity, and the third semiconductor layer 606c having n-type conductivity are stacked.

The first semiconductor layer 606a is a p-type semiconductor layer and can be formed using a silicon film containing an impurity element imparting p-type conductivity. The second semiconductor layer 606b is an i-type semiconductor layer and can be formed using a substantially intrinsic silicon film. The third semiconductor layer 606c is an n-type semiconductor layer and can be formed using a silicon film containing an impurity element imparting n-type conductivity.

The above silicon films can be formed by a plasma CVD method, and silane ($SiH_4$) may be used as a semiconductor source gas. Alternatively, $Si_2H_6$, $SiH_2Cl_2$, $SiHCl_3$, $SiCl_4$, $SiF_4$, or the like may be used. As another method for forming a silicon film, an LPCVD method, a sputtering method, or the like can be used.

For example, the first semiconductor layer 606a is formed to a thickness of larger than or equal to 10 nm and smaller than or equal to 50 nm by a plasma CVD method with the use of a semiconductor source gas containing an impurity element belonging to Group 13 (e.g., boron (B)). The second semiconductor layer 606b is formed to a thickness of larger than or equal to 200 nm and smaller than or equal to 1000 nm by a plasma CVD method with the use of only a semiconductor source gas or a semiconductor source gas to which an impurity element belonging to Group 13 (e.g., boron (B)) is slightly added. The third semiconductor layer 606c is formed to a thickness of larger than or equal to 20 nm and smaller than or equal to 200 nm by a plasma CVD method with the use of a semiconductor source gas containing an impurity element belonging to Group 15 (e.g., phosphorus (P)).

Alternatively, the first semiconductor layer 606a and the third semiconductor layer 606c may be formed in such a manner that a silicon film which does not contain an impurity element is formed and then an impurity element is introduced into the silicon film by a diffusion method or an ion implantation method. Heating or the like is performed after introducing the impurity element with an ion implantation method or the like, whereby the impurity element can be diffused.

Note that the structure of the above silicon films is not limited to an amorphous structure, and the above silicon films may have crystallinity. For example, when an i-type semiconductor layer is formed using amorphous silicon, a sensor having light-receiving sensitivity to light in the visible-light wavelength range can be formed. On the other hand, when an i-type semiconductor layer is formed using microcrystalline silicon or polycrystalline silicon, a sensor having light-receiving sensitivity to not only light in the visible-light wavelength range but also ultraviolet light can be formed. Further, in the case where a p-type semiconductor layer and an n-type semiconductor layer are formed using microcrystalline silicon or the like, the resistance thereof can be made smaller than that of a p-type semiconductor layer and an n-type semiconductor layer formed using amorphous silicon.

The microcrystalline semiconductor belongs to a metastable state of an intermediate between an amorphous state and a single crystal state when Gibbs free energy is considered. That is, the microcrystalline semiconductor is a semiconductor having a third state which is stable in terms of free energy and has a short range order and lattice distortion. Columnar-like or needle-like crystals grow in a normal direction with respect to a substrate surface. The peak of the Raman spectrum of microcrystalline silicon, which is a typical example of a microcrystalline semiconductor, is shifted to a lower wave number than 520 $cm^{-1}$ that represents a peak of the Raman spectrum of single crystal silicon. That is, the peak of the Raman spectrum of microcrystalline silicon is within the range from 520 $cm^{-1}$ that represents single crystal silicon, to 480 $cm^{-1}$ that represents amorphous silicon. The microcrystalline silicon contains hydrogen or halogen of at least 1 at. % to terminate a dangling bond. Moreover, microcrystalline silicon is made to contain a rare gas element such as helium, argon, krypton, or neon to further enhance lattice distortion, whereby stability is increased and a favorable microcrystalline semiconductor can be obtained.

This microcrystalline semiconductor can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor can be formed using a gas obtained by diluting silicon hydride, such as $SiH_4$, $Si_2H_6$, $SiH_2Cl_2$, $SiHCl_3$, $SiCl_4$, or $SiF_4$, with hydrogen. In that case, the flow ratio of hydrogen to silicon hydride is 5:1 to 200:1, preferably 50:1 to 150:1, more preferably 100:1. With a dilution with one or plural kinds of rare gas elements selected from helium, argon, krypton, and neon in addition to silicon hydride and hydrogen, the microcrystalline semiconductor can be formed. Alternatively, a carbide gas such as $CH_4$ or $C_2H_6$, a germanium gas such as $GeH_4$ or $GeF_4$, $F_2$, or the like may be added to silicon hydride and hydrogen.

In addition, since the mobility of holes generated by a photoelectric effect is lower than that of electrons, a surface on the p-type semiconductor layer side in the PIN photodiode is preferably used as a light-receiving plane in order to extract holes efficiently. Note that a surface on the n-type semiconductor layer side can be used as a light-receiving plane. Here, the photodiode 602 is irradiated with light from the substrate 601 side, over which the PIN photodiode is formed. In order to block light from the substrate 613 side, the electrode layer 642 is preferably formed using a light-blocking conductive film.

For a reduction of the surface roughness, an insulating layer serving as a planarizing insulating film is preferably used as the first interlayer insulating layer 633 and the second interlayer insulating layer 634. The insulating layer can be formed using, for example, an organic insulating material such as polyimide, an acrylic resin, a benzocyclobutene resin, polyamide, or an epoxy resin. In addition to such organic insulating materials, it is possible to use a single layer of a low-dielectric constant material (a low-k material), a siloxane-based resin, phosphosilicate glass (PSG), borophosphosilicate glass (BPSG), or the like or a stacked layer thereof.

The formation methods of the insulating layer 631, the protective insulating layer 632, the first interlayer insulating layer 633, and the second interlayer insulating layer 634 are not particularly limited, and they may each be formed using an appropriate insulating material by a sputtering method, a spin coating method, a dipping method, spray coating, a droplet discharge method (e.g., an inkjet method, screen printing, or offset printing), a roll coating method, a curtain coating method, a knife coating method, or the like.

When the light that enters the photodiode 602 is detected, data on an object to be detected can be read. Note that external light or a light source such as a backlight is used at the time of reading data on the object.

Note that the above photo sensor circuit may be provided with the display element described in another embodiment. When the photo sensor circuit is provided with the display element, it can function as a touch panel.

The transistor one example of which is described in Embodiment 1 can be used as the transistor 640. The electrical characteristics of the transistor including the oxide semiconductor layer, which is highly purified by intentionally removing impurities such as hydrogen, moisture, a hydroxyl group, or hydride (also referred to as a hydrogen compound) and contains excessive oxygen supplied by oxygen doping, are less likely to change, and thus the transistor is electrically stable. Therefore, a highly reliable semiconductor device can be provided.

This embodiment can be implemented in combination with any of the other embodiments as appropriate.

Embodiment 4

A semiconductor device disclosed in this specification can be applied to a variety of electronic devices (including amusement machines). Examples of electronic devices include television sets (also referred to as televisions or television receivers), monitors of computers or the like, cameras such as digital cameras or digital video cameras, digital photo frames, mobile phones (also referred to as cellular phones or cellular phone devices), portable game consoles, portable information terminals, audio reproducing devices, large-sized game machines such as pachinko machines, and the like. Examples of electronic devices each including the liquid crystal display device described in the above embodiment will be described.

Figure 10A:
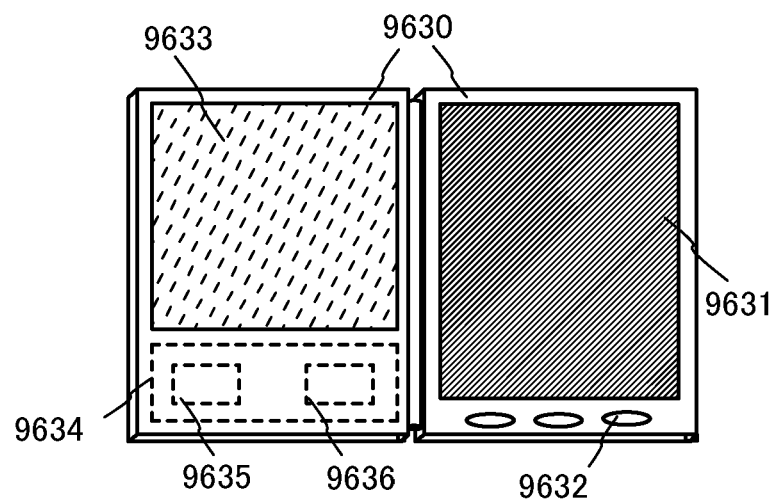
FIGS. 10A and 10B illustrate an electronic device and a block diagram of the electronic device.

FIG. 10A illustrates an electronic book reader (also referred to as an e-book reader) that can include housings 9630, a display portion 9631, operation keys 9632, a solar cell 9633, and a charge and discharge control circuit 9634. The electronic book reader in FIG. 10A can have a function of displaying a variety of information (e.g., a still image, a moving image, and a text image) on the display portion, a function of displaying a calendar, a date, the time, and the like on the display portion, a function of operating or editing the information displayed on the display portion, a function of controlling processing by various kinds of software (programs), and the like. Note that in FIG. 10A, a structure including a battery 9635 and a DCDC converter (hereinafter abbreviated as a converter) 9636 is illustrated as an example of the charge and discharge control circuit 9634. By applying the semiconductor device described in another embodiment to the display portion 9631, the electronic book reader can be highly reliable.

In the structure of FIG. 10A, a semi-transmissive or reflective liquid crystal display device is used as the display portion 9631, whereby the electronic book reader is excellent in visibility even in a relatively bright environment. In such an environment, power generation by the solar cell 9633 and charge with the battery 9635 can be efficiently performed. Note that the solar cell 9633 can be provided in not only the illustrated region but also a space (a surface or a rear surface) of the housing 9630 as appropriate. When a lithium ion battery is used as the battery 9635, there is an advantage of downsizing or the like.

Figure 10B:
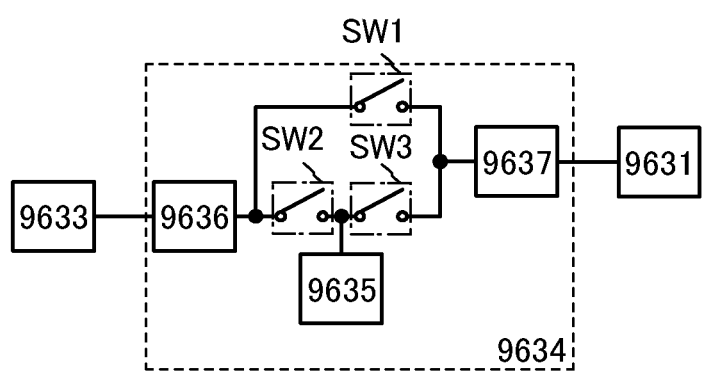

The structure and the operation of the charge and discharge control circuit 9634 illustrated in FIG. 10A will be described with reference to a block diagram in FIG. 10B. The solar cell 9633, the battery 9635, the converter 9636, a converter 9637, switches SW1 to SW3, and the display portion 9631 are shown in FIG. 10B. The battery 9635, the converter 9636, the converter 9637, and the switches SW1 to SW3 are included in the charge and discharge control circuit 9634.

First, an example of operation in the case where power is generated by the solar cell 9633 using external light is described. The voltage of power generated by the solar cell is raised or lowered by the converter 9636 to a suitable voltage for charging the battery 9635. Then, when the power from the solar cell 9633 is used for the operation of the display portion 9631, the switch SW1 is turned on and the voltage of the power is raised or lowered by the converter 9637 to a voltage needed for the display portion 9631. In addition, when display on the display portion 9631 is not performed, the switch SW1 is turned off and the switch SW2 is turned on so that charge of the battery 9635 may be performed.

Next, operation in the case where power is not generated by the solar cell 9633 owing to lack of external light is described. The voltage of power accumulated in the battery 9635 is raised or lowered by the converter 9637 by turning on the switch SW3. Then, power from the battery 9635 is used for the operation of the display portion 9631.

Note that the solar cell is described as one example of a means for charging, the battery 9635 may be charged with another means or with a combination of the solar cell and another means.

Figure 11A:
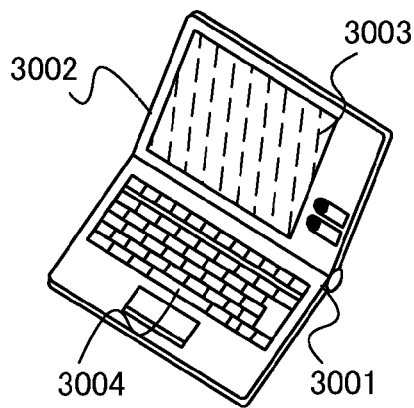
FIGS. 11A to 11F each illustrate an electronic device.

FIG. 11A illustrates a laptop personal computer, which includes a main body 3001, a housing 3002, a display portion 3003, a keyboard 3004, and the like. By applying the semiconductor device described in another embodiment to the display portion 3003, the laptop personal computer can be highly reliable.

Figure 11B:
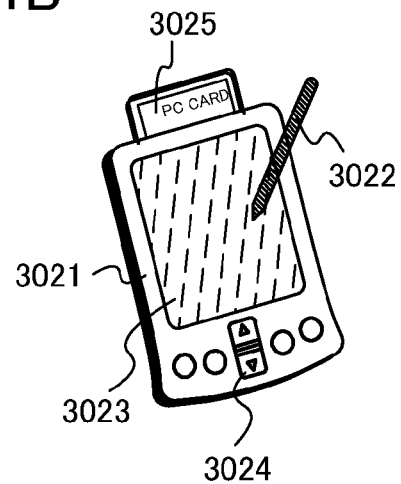

FIG. 11B is a personal digital assistant (PDA), which includes a main body 3021 provided with a display portion 3023, an external interface 3025, operation buttons 3024, and the like. A stylus 3022 is included as an accessory for operation. By applying the semiconductor device described in another embodiment to the display portion 3023, the personal digital assistant (PDA) can be highly reliable.

Figure 11C:
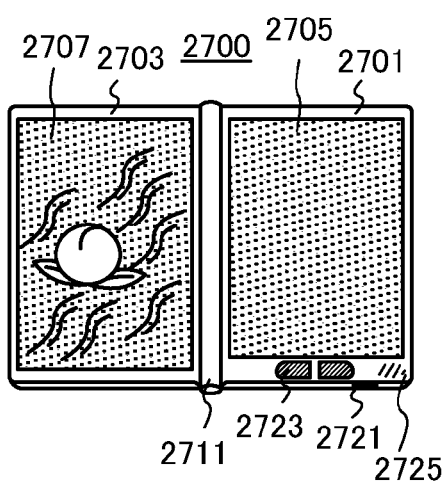

FIG. 11C illustrates an example of an electronic book reader. For example, an electronic book reader 2700 has two housings, a housing 2701 and a housing 2703. The housing 2701 and the housing 2703 are combined with a hinge 2711. The electronic book reader 2700 can be opened and closed with the hinge 2711 as an axis, and can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 11C) and images can be displayed on a display portion on the left side (the display portion 2707 in FIG. 11C). By applying the semiconductor device described in another embodiment to the display portions 2705 and 2707, the electronic book reader 2700 can be highly reliable.

FIG. 11C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 11D:
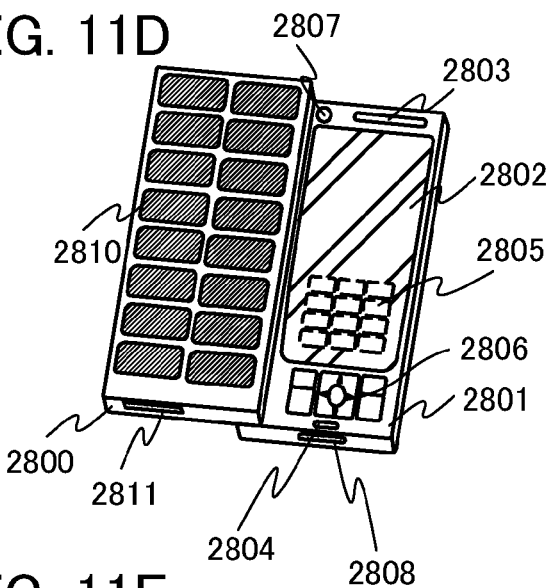

FIG. 11D illustrates a mobile phone, which includes two housings, a housing 2800 and a housing 2801. The housing 2801 includes a display panel 2802, a speaker 2803, a microphone 2804, a pointing device 2806, a camera 2807, an external connection terminal 2808, and the like. In addition, the housing 2800 includes a solar cell 2810 having a function of charge of the mobile phone, an external memory slot 2811, and the like. An antenna is incorporated in the housing 2801. By applying the semiconductor device described in another embodiment to the display panel 2802, the mobile phone can be highly reliable.

Further, the display panel 2802 is provided with a touch panel. A plurality of operation keys 2805 which are displayed as images are illustrated by dashed lines in FIG. 11D. Note that a boosting circuit by which a voltage output from the solar cell 2810 is increased to be sufficiently high for each circuit is also provided.

The display direction of the display panel 2802 is changed as appropriate depending on a usage pattern. Further, since the mobile phone includes the camera 2807 on the same surface as the display panel 2802, it can be used as a video phone. The speaker 2803 and the microphone 2804 can be used for voice recording, playback, and the like as well as voice calls. Furthermore, the housings 2800 and 2801 which are developed as illustrated in FIG. 11D can overlap with each other by sliding; thus, the size of the mobile phone can be decreased, which makes the mobile phone suitable for being carried.

The external connection terminal 2808 can be connected to various types of cables such as a charging cable and a USB cable, and charge and data communication with a personal computer or the like are possible. Further, a large amount of data can be handled by insertion of a high-capacity storage medium into the external memory slot 2811.

Further, in addition to the above functions, an infrared communication function, a television reception function, or the like may be provided.

Figure 11E:
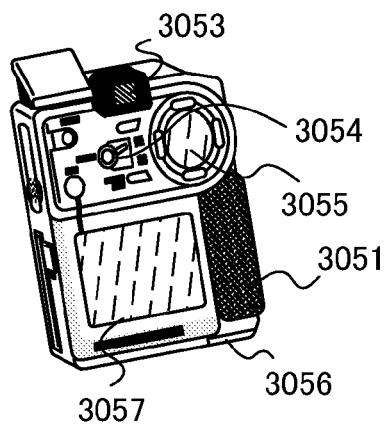

FIG. 11E illustrates a digital video camera, which includes a main body 3051, a display portion A 3057, an eyepiece 3053, an operation switch 3054, a display portion B 3055, a battery 3056, and the like. By applying the semiconductor device described in another embodiment to the display portion A 3057 and the display portion B 3055, the digital video camera can be highly reliable.

Figure 11F:
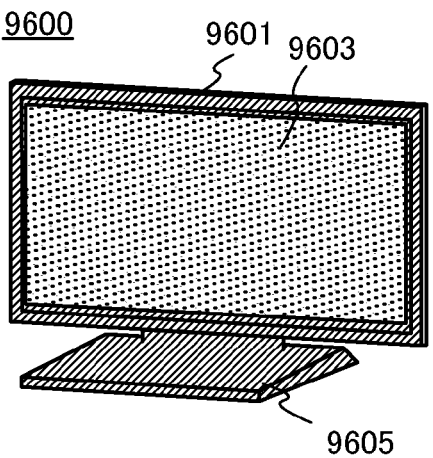

FIG. 11F illustrates an example of a television set. In a television set 9600, a display portion 9603 is incorporated in a housing 9601. The display portion 9603 can display images. Here, the housing 9601 is supported by a stand 9605. By applying the semiconductor device described in another embodiment to the display portion 9603, the television set 9600 can be highly reliable.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in combination with any of the other embodiments as appropriate.

This application is based on Japanese Patent Application serial no. 2010-117332 filed with Japan Patent Office on May 21, 2010, the entire contents of which are hereby incorporated by reference.

What is claimed is:

1. A method for manufacturing a semiconductor device, comprising the sequential steps of:
   forming a gate electrode;
   forming a gate insulating layer over the gate electrode;
   forming an oxide semiconductor layer over the gate insulating layer so as to overlap with the gate electrode;
   increasing a temperature of the oxide semiconductor layer in an inert gas atmosphere, a dry air atmosphere, or an oxygen atmosphere;
   performing first heat treatment on the oxide semiconductor layer under reduced pressure after the step of increasing the temperature of the oxide semiconductor layer;
   performing second heat treatment on the oxide semiconductor layer in an oxygen atmosphere after the step of performing the first heat treatment;
   decreasing a temperature of the oxide semiconductor layer in the oxygen atmosphere after the step of performing the second heat treatment;
   forming a source electrode and a drain electrode which are electrically connected to the oxide semiconductor layer after the step of decreasing the temperature of the oxide semiconductor layer; and forming an insulating layer over the oxide semiconductor layer, the source electrode, and the drain electrode.

2. The method for manufacturing a semiconductor device, according to claim 1, wherein a dew point of an atmosphere gas used in increasing the temperature, performing the first heat treatment, performing the second heat treatment, and decreasing the temperature is −50° C. or lower.

3. The method for manufacturing a semiconductor device, according to claim 1, wherein a temperature of the first heat treatment is higher than or equal to 250° C. and lower than or equal to 650° C.

4. The method for manufacturing a semiconductor device, according to claim 1, wherein a temperature of the second heat treatment is higher than or equal to 250° C. and lower than or equal to 650° C.

5. The method for manufacturing a semiconductor device, according to claim 1, wherein the first heat treatment and the second heat treatment are performed in a state where the oxide semiconductor layer is irradiated with light having a wavelength longer than or equal to 350 nm and shorter than or equal to 450 nm.

6. The method for manufacturing a semiconductor device, according to claim 1, wherein the first heat treatment and the second heat treatment under dry condition are repeated a plurality of times.

7. The method for manufacturing a semiconductor device, according to claim 1, wherein the oxide semiconductor layer is subjected to oxygen doping treatment after the step of decreasing the temperature of the oxide semiconductor layer.

8. A method for manufacturing a semiconductor device, comprising the sequential steps of:
   forming an oxide semiconductor layer;
   increasing a temperature of the oxide semiconductor layer in an inert gas atmosphere, a dry air atmosphere, or an oxygen atmosphere;
   performing first heat treatment on the oxide semiconductor layer under reduced pressure after the step of increasing the temperature of the oxide semiconductor layer;
   performing second heat treatment on the oxide semiconductor layer in an oxygen atmosphere after the step of performing the first heat treatment; and
   decreasing a temperature of the oxide semiconductor layer in the oxygen atmosphere after the step of performing the second heat treatment.

9. The method for manufacturing a semiconductor device, according to claim 8, wherein a dew point of an atmosphere gas used in increasing the temperature, performing the first heat treatment, performing the second heat treatment, and decreasing the temperature is −50° C. or lower.

10. The method for manufacturing a semiconductor device, according to claim 8, wherein a temperature of the first heat treatment is higher than or equal to 250° C. and lower than or equal to 650° C.

11. The method for manufacturing a semiconductor device, according to claim 8, wherein a temperature of the second heat treatment is higher than or equal to 250° C. and lower than or equal to 650° C.

12. The method for manufacturing a semiconductor device, according to claim 8, wherein the first heat treatment and the second heat treatment are performed in a state where the oxide semiconductor layer is irradiated with light having a wavelength longer than or equal to 350 nm and shorter than or equal to 450 nm.

13. The method for manufacturing a semiconductor device, according to claim 8, wherein the first heat treatment and the second heat treatment under dry condition are repeated a plurality of times.

14. The method for manufacturing a semiconductor device, according to claim 8, wherein the oxide semiconductor layer is subjected to oxygen doping treatment after the step of decreasing the temperature of the oxide semiconductor layer.

15. The method for manufacturing a semiconductor device, according to claim 8, wherein an oxygen pressure in the first heat treatment is lower than an oxygen pressure in the second heat treatment.

* * * * *